(12) United States Patent
Yu et al.

(10) Patent No.: US 10,276,469 B2
(45) Date of Patent: Apr. 30, 2019

(54) METHOD FOR FORMING SEMICONDUCTOR DEVICE STRUCTURE

(71) Applicant: Taiwan Semiconductor Manufacturing Co., Ltd, Hsin-Chu (TW)

(72) Inventors: Weibo Yu, Hsinchu (TW); Jui-Ping Chuang, Hsinchu (TW); Chen-Hsiang Lu, Hsinchu (TW); Shao-Yen Ku, Jhubei (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/689,210

(22) Filed: Apr. 17, 2015

(65) Prior Publication Data
US 2016/0307816 A1    Oct. 20, 2016

(51) Int. Cl.
| | |
|---|---|
| *H01L 21/311* | (2006.01) |
| *H01L 21/302* | (2006.01) |
| *H01L 23/31* | (2006.01) |
| *H01L 21/02* | (2006.01) |
| *H01L 21/677* | (2006.01) |

(52) U.S. Cl.
CPC ...... *H01L 23/3157* (2013.01); *H01L 21/0206* (2013.01); *H01L 21/02019* (2013.01); *H01L 21/0226* (2013.01); *H01L 21/02057* (2013.01); *H01L 21/02203* (2013.01); *H01L 21/67703* (2013.01)

(58) Field of Classification Search
CPC ............. H01L 23/3157; H01L 21/0206; H01L 21/0226; H01L 21/02019; H01L 21/67703; H01L 21/02203
USPC .......... 216/58, 57, 67, 83, 90; 438/126, 758, 438/761, 778, 786, 694, 689, 690, 691, 438/696
See application file for complete search history.

(56) References Cited

U.S. PATENT DOCUMENTS

| | | | | |
|---|---|---|---|---|
| 4,132,823 A | * | 1/1979 | Blackwell | C09D 5/002 428/215 |
| 5,753,563 A | * | 5/1998 | Guan | B08B 7/0028 257/E21.224 |

(Continued)

*Primary Examiner* — Nadine G Norton
*Assistant Examiner* — Christopher Remavege
(74) *Attorney, Agent, or Firm* — McClure, Qualey & Rodack, LLP

(57) ABSTRACT

A method for forming a semiconductor device structure is provided. The method includes performing a first process over a surface of a semiconductor substrate. The method includes forming a protective layer over the surface of the semiconductor substrate in a first chamber after the first process. The method includes performing a first transferring process to transfer the semiconductor substrate from the first chamber into a substrate carrier. The method includes performing a second transferring process to transfer the semiconductor substrate from the substrate carrier into a second chamber. The semiconductor substrate is located in the substrate carrier during a substantially entire first time interval between the first transferring process and the second transferring process. The method includes removing the substantially entire protective layer in the second chamber. The method includes performing a second process over the surface of the semiconductor substrate.

20 Claims, 23 Drawing Sheets

(56) References Cited

U.S. PATENT DOCUMENTS

| | | | |
|---|---|---|---|
| 6,032,704 A | | 3/2000 | Huang et al. |
| 6,794,751 B2 * | | 9/2004 | Kumamoto ............ H01L 21/563 |
| | | | 257/738 |
| 6,825,120 B1 * | | 11/2004 | Liu ................... H01L 21/76877 |
| | | | 216/67 |
| 7,482,249 B2 * | | 1/2009 | Jakob ................. H01L 21/6836 |
| | | | 438/460 |
| 8,048,717 B2 | | 11/2011 | Liu et al. |
| 2004/0169012 A1 * | | 9/2004 | Carpenter ............. B08B 7/0014 |
| | | | 216/83 |
| 2005/0133340 A1 * | | 6/2005 | Horn .................... B65G 49/064 |
| | | | 198/348 |
| 2007/0254491 A1 * | | 11/2007 | Cheung ............. H01L 21/02063 |
| | | | 438/758 |
| 2008/0026492 A1 * | | 1/2008 | Richter ............. H01L 21/02074 |
| | | | 438/17 |
| 2010/0258142 A1 * | | 10/2010 | Kawaguchi ............... B08B 3/08 |
| | | | 134/1.3 |
| 2010/0313917 A1 * | | 12/2010 | Kawaguchi ........... B08B 7/0014 |
| | | | 134/36 |
| 2011/0250401 A1 * | | 10/2011 | Dudley ............. H01L 21/02096 |
| | | | 428/161 |
| 2015/0079799 A1 * | | 3/2015 | Nemani ............ H01J 37/32082 |
| | | | 438/714 |
| 2015/0158649 A1 * | | 6/2015 | Huang ............... H05K 13/0084 |
| | | | 206/714 |
| 2016/0049309 A1 * | | 2/2016 | Tapily ............... H01L 21/31116 |
| | | | 438/703 |

* cited by examiner

METHOD FOR FORMING SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
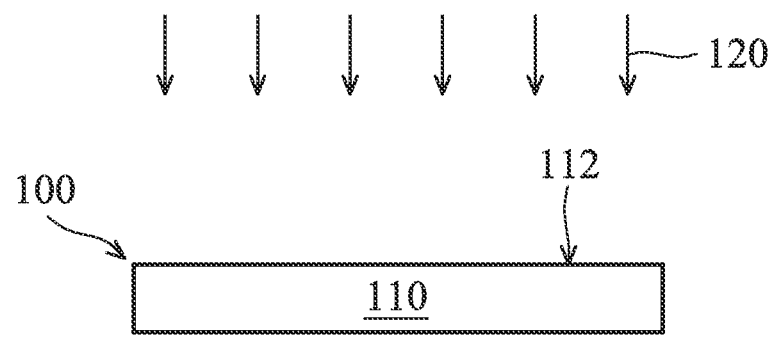
FIGS. 1A-1F are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 2:
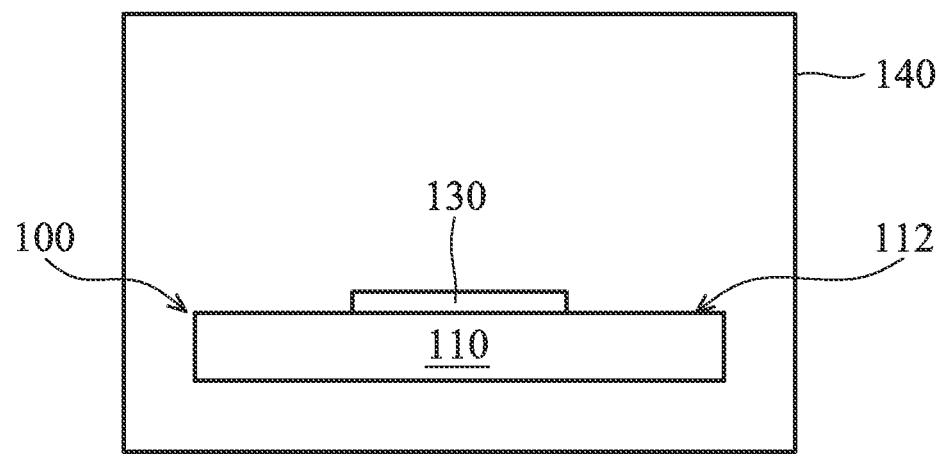
FIG. 2 is a cross-sectional view of a variation of the stage of FIG. 1B, in accordance with some embodiments.
Figure 3:
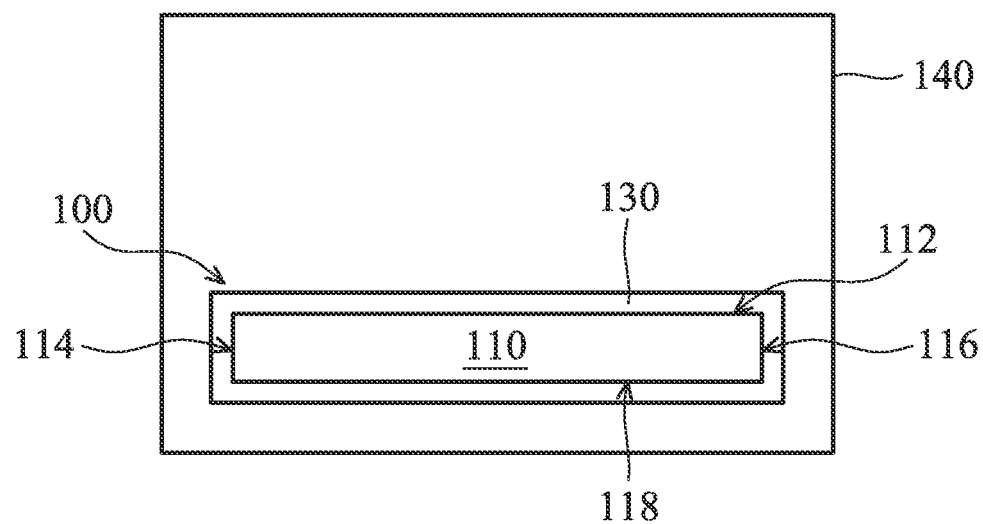
FIG. 3 is a cross-sectional view of a variation of the stage of FIG. 1B, in accordance with some embodiments.

FIGS. 1A-1F are cross-sectional views of various stages of a process for forming a semiconductor device structure 100, in accordance with some embodiments. FIG. 2 is a cross-sectional view of a variation of the stage of FIG. 1B, in accordance with some embodiments. FIG. 3 is a cross-sectional view of a variation of the stage of FIG. 1B, in accordance with some embodiments.

Figure 1B:
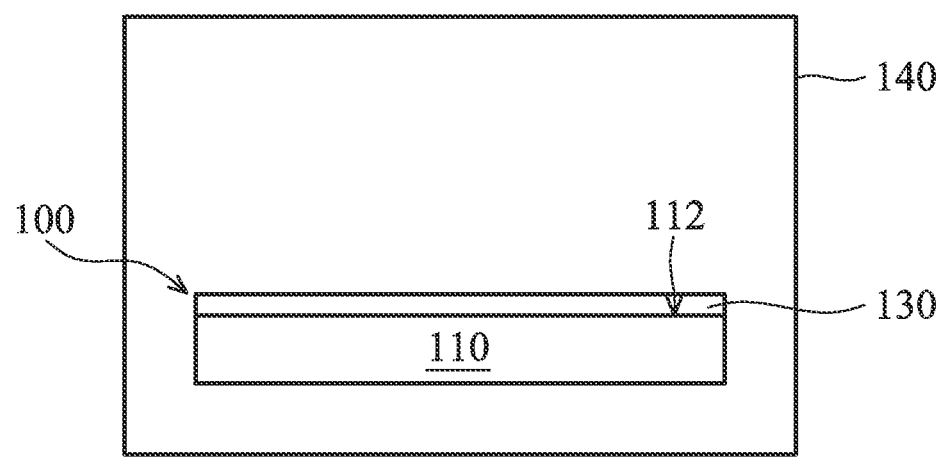
Figure 4:
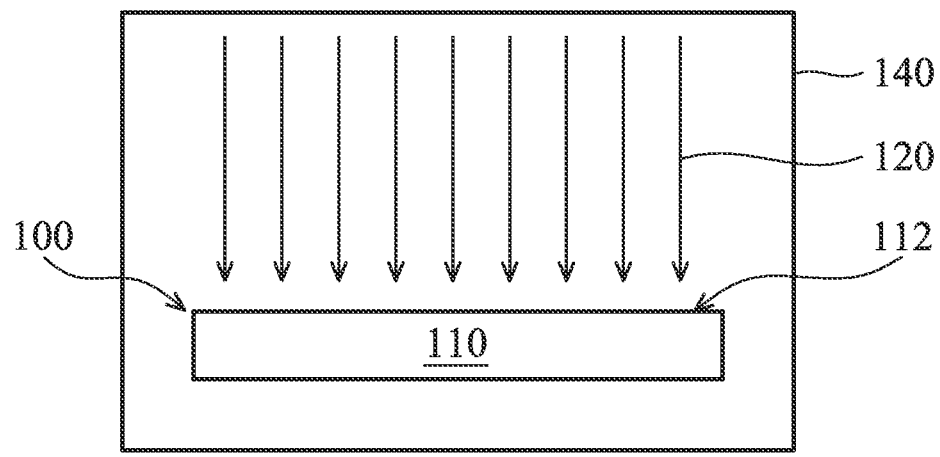
FIG. 4 is a cross-sectional view of a variation of the stages of FIGS. 1A and 1B, in accordance with some embodiments.
Figure 5:
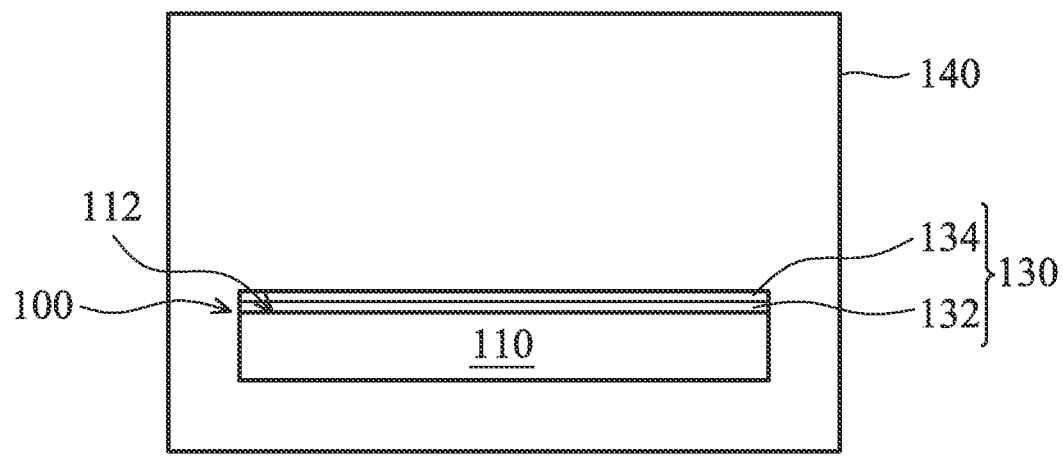
FIG. 5 is a cross-sectional view of a variation of the stage of FIG. 1B, in accordance with some embodiments.
Figure 6:
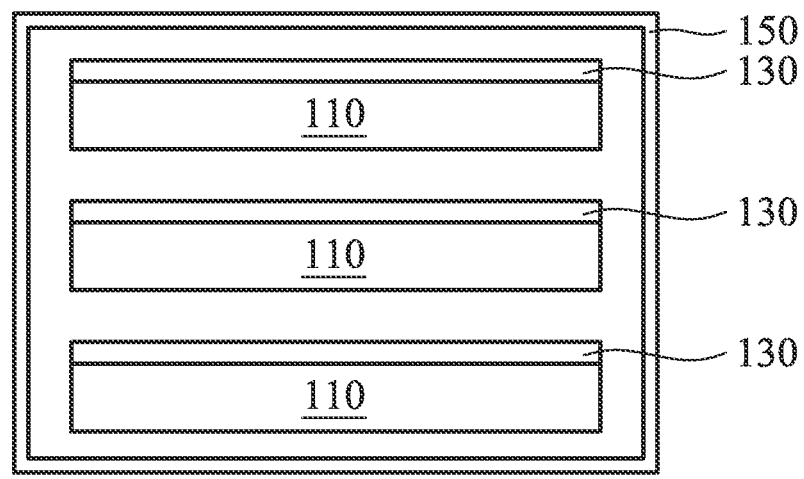
FIG. 6 is a cross-sectional view of a variation of the stage of FIG. 1C, in accordance with some embodiments.
Figure 7:
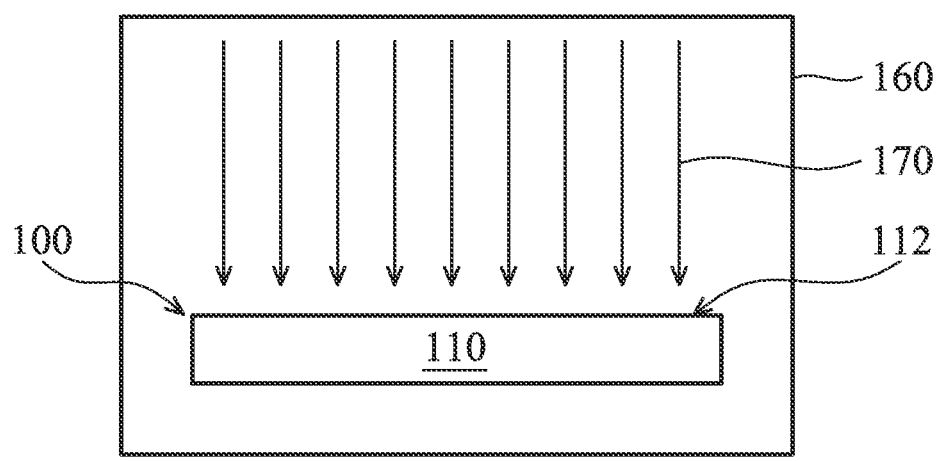
FIG. 7 is a cross-sectional view of a variation of the stages of FIGS. 1E and 1F, in accordance with some embodiments.

FIG. 4 is a cross-sectional view of a variation of the stages of FIGS. 1A and 1B, in accordance with some embodiments. FIG. 5 is a cross-sectional view of a variation of the stage of FIG. 1B, in accordance with some embodiments. FIG. 6 is a cross-sectional view of a variation of the stage of FIG. 1C, in accordance with some embodiments. FIG. 7 is a cross-sectional view of a variation of the stages of FIGS. 1E and 1F, in accordance with some embodiments.

As shown in FIG. 1A, a semiconductor substrate 110 is provided. The semiconductor substrate 110 includes a semiconductor wafer (such as a silicon wafer) or a portion of a semiconductor wafer. In some embodiments, the semiconductor substrate 110 is made of an elementary semiconductor material including silicon or germanium in a single crystal, polycrystal, or amorphous structure.

In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

As shown in FIG. 1A, a first process 120 is performed over a top surface 112 of the semiconductor substrate 110, in accordance with some embodiments. The first process 120 includes an etching process, a deposition process, a cleaning process, an implantation process, an oxidation process, a surface treatment process, or another suitable process.

The first process 120 may form a feature structure over (or in) the semiconductor substrate 110. The feature structure includes an element over the semiconductor substrate 110, a recess, a doped region in the semiconductor substrate 110, or another suitable structure. For the sake of simplicity, the feature structure is not shown in FIG. 1A, and detailed description of exemplary embodiments relating to the feature structure is described below.

As shown in FIG. 1B, after the first process 120, a protective layer 130 is formed over the top surface 112 of the semiconductor substrate 110 in a first chamber 140, in accordance with some embodiments. The protective layer 130 is configured to protect the top surface 112 of the semiconductor substrate 110 from being contaminated during a subsequent queue time, in accordance with some embodiments. In some embodiments, the protective layer 130 is configured to remove outgassing from the semiconductor substrate 110 during the subsequent queue time.

The protective layer 130 covers the substantially entire top surface 112, in accordance with some embodiments. In another embodiment, as shown in FIG. 2, the protective layer 130 covers only a portion of the top surface 112, in accordance with some embodiments. In still another embodiment, as shown in FIG. 3, the protective layer 130 covers the top surface 112, sidewalls 114 and 116, and a bottom surface 118 of the semiconductor substrate 110, in accordance with some embodiments.

The protective layer 130 includes an insulating material, in accordance with some embodiments. The protective layer 130 includes an organic material, a sulfide material, a porous material, an oxide material, or a nitride material, in accordance with some embodiments. The organic material includes hexamethyldisilazane (HMDS), a polymer material (e.g., a photoresist material), or another suitable organic material. The sulfide material includes hydrogen sulfide ($H_2S$), in accordance with some embodiments. The porous material includes a carbon material (e.g., activated carbon), in accordance with some embodiments. The protective layer 130 formed of the porous material serves as a getter layer to remove outgassing from the semiconductor substrate 110, in accordance with some embodiments.

The protective layer 130 is formed using a coating process (e.g., a spin coating process), a deposition process (e.g., a chemical vapor deposition process or a physical vapor deposition process), an oxidation process, a dipping process, or another suitable process. The protective layer 130 is conformally formed over the top surface 112, in accordance with some embodiments.

In some embodiments, the protective layer 130 is a planar layer. In some embodiments, as shown in FIG. 4, the first process 120 is also performed in the first chamber 140. For example, the first process 120 includes a deposition process, and the first chamber 140 is a deposition chamber.

In some other embodiments, as shown in FIG. 5, the protective layer 130 has a first film 132 and a second film 134. The first film 132 is between the second film 134 and the semiconductor substrate 110, in accordance with some embodiments. The materials of the first film 132 and the second film 134 are different, in accordance with some embodiments.

The first film 132 includes a porous material (e.g., a carbon material) to remove outgassing from the semiconductor substrate 110, in accordance with some embodiments. The second film 134 includes an organic material, a sulfide material, an oxide material, or a nitride material, in accordance with some embodiments.

Figure 1C:
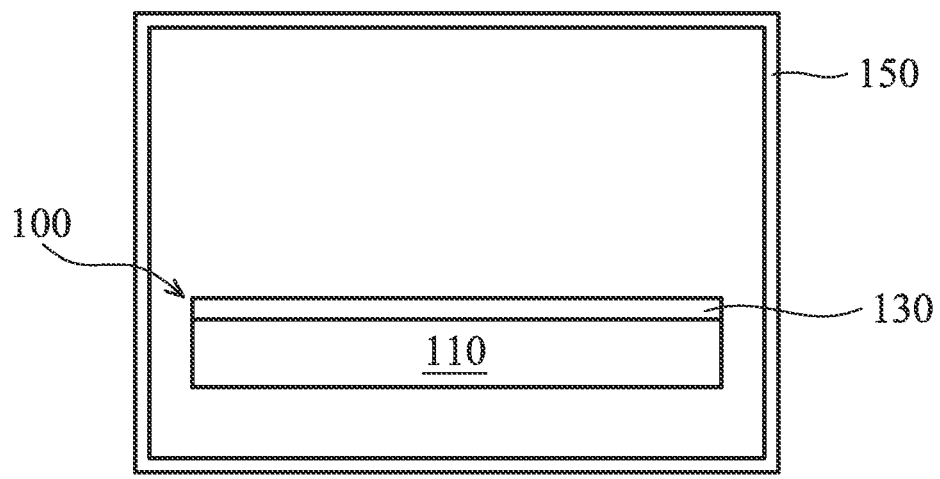

As shown in FIG. 1C, a first transferring process is performed to transfer the semiconductor substrate 110 and the protective layer 130 from the first chamber 140 into a substrate carrier 150, in accordance with some embodiments. The substrate carrier 150 includes a wafer carrier, in accordance with some embodiments. The substrate carrier 150 includes a front opening unified pod (FOUP), in accordance with some embodiments. In some embodiments, nitrogen or inert gas (e.g., argon or helium) is filled in the substrate carrier 150.

As shown in FIG. 6, the substrate carrier 150 may contain many substrates 110. For the sake of simplicity, FIG. 1C shows only one semiconductor substrate 110. Thereafter, the semiconductor substrate 110 and the protective layer 130 are kept in the substrate carrier 150 for a queue time to wait until a chamber (or a tool) for performing the next process is available, in accordance with some embodiments.

Figure 1D:
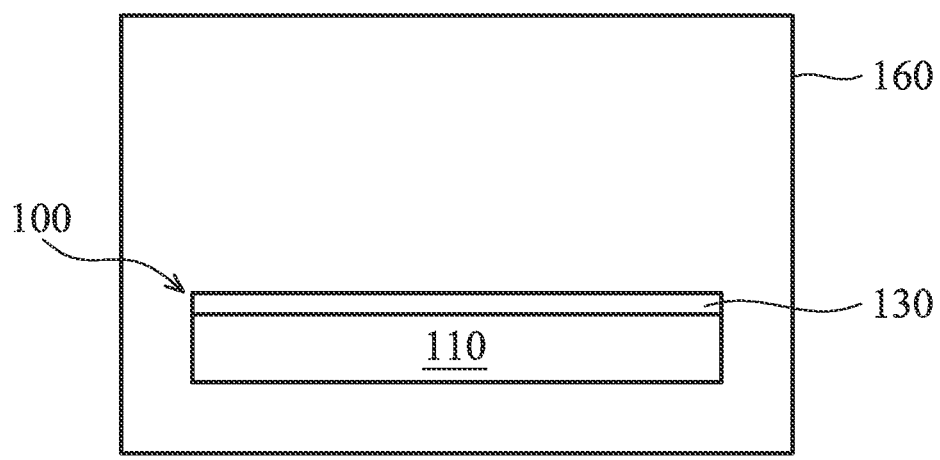

As shown in FIG. 1D, after the queue time, a second transferring process is performed to transfer the semiconductor substrate 110 and the protective layer 130 from the substrate carrier 150 into a second chamber 160, in accordance with some embodiments. The semiconductor substrate 110 and the protective layer 130 are located in the substrate carrier 150 during a substantially entire first time interval between the first transferring process and the second transferring process, in accordance with some embodiments.

That is, in the substantially entire first time interval, the semiconductor substrate 110 and the protective layer 130 are kept in the substrate carrier 150, and there is no treatment process performed over the semiconductor substrate 110 and the protective layer 130, in accordance with some embodiments.

Figure 1E:
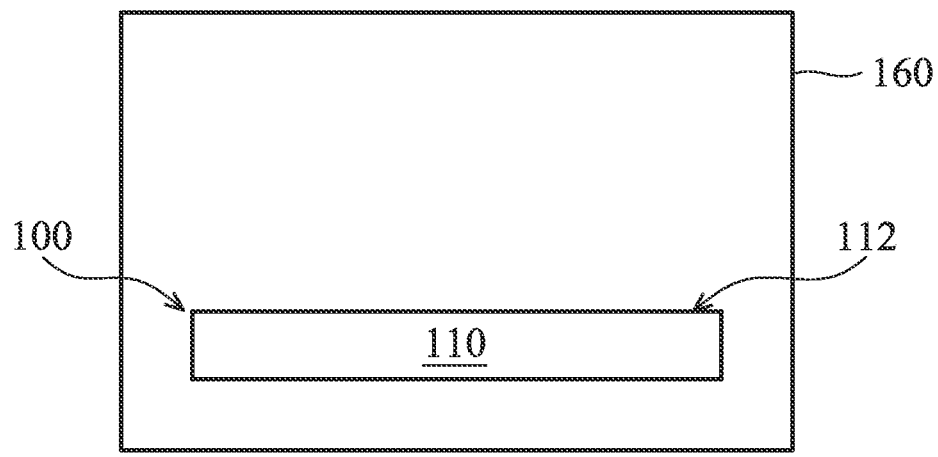

As shown in FIG. 1E, the substantially entire protective layer 130 is removed in the second chamber 160, in accordance with some embodiments. A negligible portion of the protective layer 130 may be left after the removal process. The removal process includes a dry etching process, a wet etching process, a chemical mechanical polishing process, a cleaning process, or another suitable process.

The dry etching process includes an ashing process (e.g., an oxygen plasma ashing process), in accordance with some embodiments. The cleaning process uses a cleaning solution including an ozone in deionized water ($O_3/DI$) cleaning solution or a SPM cleaning solution, in accordance with some embodiments. The SPM cleaning solution includes a mixture of sulfuric acid, a hydrogen peroxide solution, and pure water, in accordance with some embodiments.

The protective layer 130 is an outermost layer of the semiconductor device structure 100 during a substantially entire second time interval between the formation of the protective layer 130 and the removal of the protective layer 130, in accordance with some embodiments. That is, there is no layer or element formed over the protective layer 130 during the substantially entire second time interval, in accordance with some embodiments.

Since the protective layer 130 is removed, the contamination formed over the protective layer 130 during the queue time is removed as well. Therefore, the top surface 112 is kept clean after the queue time. As a result, the acceptable queue time is prolonged, which eases queue time constraints. Therefore, the second process is more manufacturable and the yield of the second process is improved.

In some embodiments, the first chamber 140 and the second chamber 160 are the same chamber. For example, the first chamber 140 (or the second chamber 160) is a plasma chamber for performing a plasma deposition process and a plasma etching process.

Figure 1F:
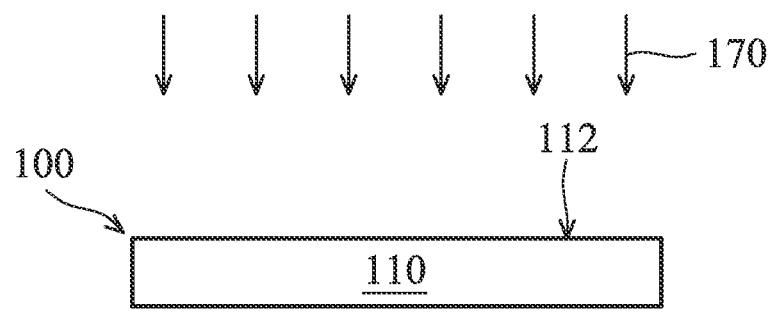

As shown in FIG. 1F, after the removal of the protective layer 130, a second process 170 is performed over the top surface 112 of the semiconductor substrate 110, in accordance with some embodiments. The second process 170 includes a cleaning process, an etching process, a deposition process, an implantation process, an oxidation process, a surface treatment process, or another suitable process.

In some other embodiments, as shown in FIG. 7, the second process 170 is performed in the second chamber 160, and the second process 170 includes a cleaning process, an etching process, a chemical mechanical polishing process, a plasma process, or another suitable process. In some embodiments, the removal of the protective layer 130 and the second process are the same process (e.g., a cleaning process, an etching process, or a chemical mechanical polishing process).

Figure 9:
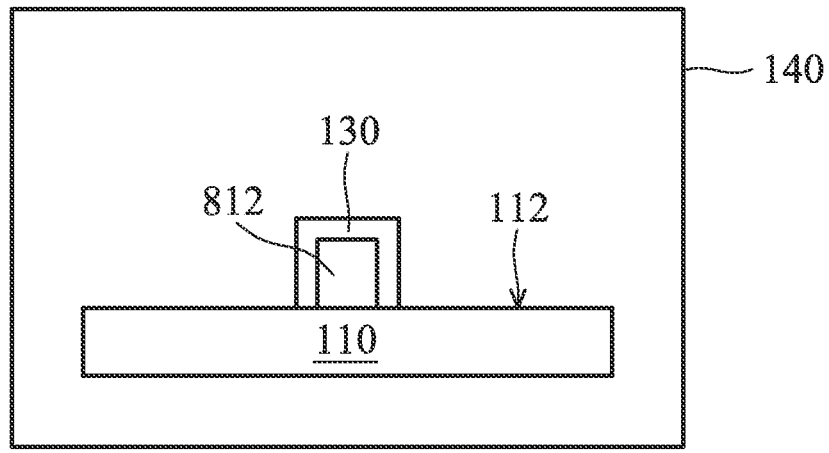
FIG. 9 is a cross-sectional view of a variation of the stage of FIG. 8B, in accordance with some embodiments.
Figure 10:
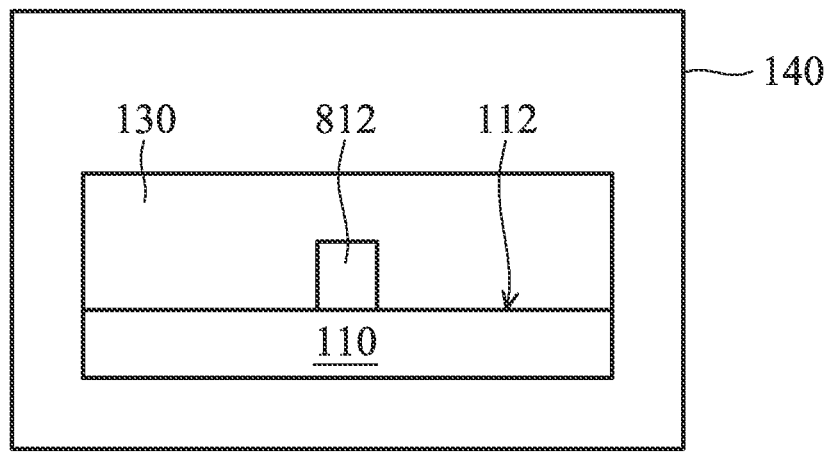
FIG. 10 is a cross-sectional view of a variation of the stage of FIG. 8B, in accordance with some embodiments.

FIGS. 8A-8F are cross-sectional views of various stages of a process for forming a semiconductor device structure 800, in accordance with some embodiments. FIG. 9 is a cross-sectional view of a variation of the stage of FIG. 8B, in accordance with some embodiments. FIG. 10 is a cross-sectional view of a variation of the stage of FIG. 8B, in accordance with some embodiments.

Figure 8A:
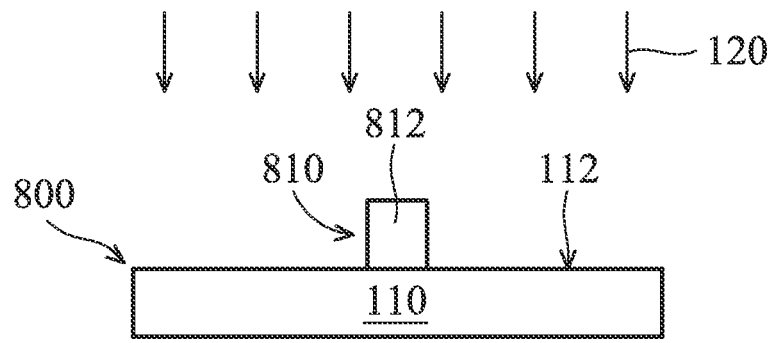
FIGS. 8A-8F are cross-sectional views of various stages of a process for forming a semiconductor device structure, in accordance with some embodiments.

It should be noted that the embodiment of FIGS. 8A-8F is a detailed embodiment of FIGS. 1A-1F, and FIGS. 8A-8F show a feature structure formed over the semiconductor substrate 110. As shown in FIG. 8A, the first process 120 is performed over the top surface 112 of the semiconductor substrate 110 to form a feature structure 810, in accordance with some embodiments. The feature structure 810 includes an element 812, in accordance with some embodiments.

The element 812 includes a gate, a capacitor, a film, an active element, a passive element, an optical element, or another element suitable for being formed over the semiconductor substrate 110. The element 812 includes a conductive structure or a semiconductor structure, in accordance with some embodiments. The first process 120 includes a deposition process (and an etching process) or another suitable process, in accordance with some embodiments.

Figure 8B:
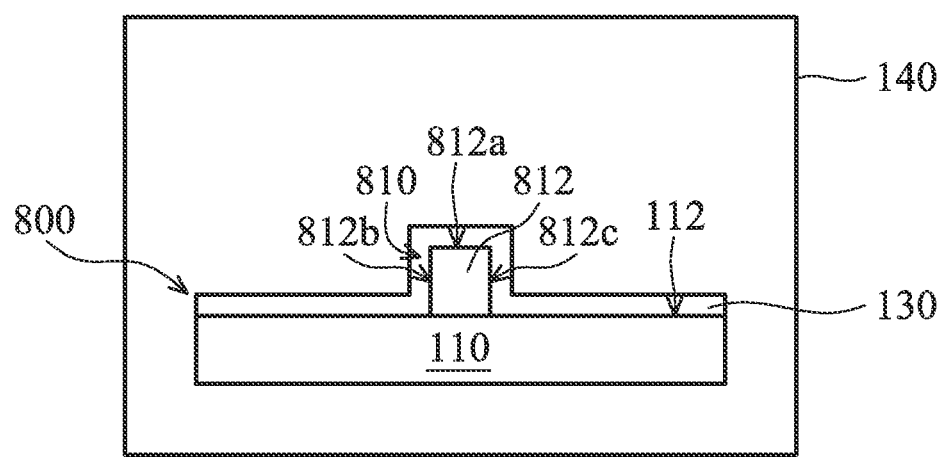

As shown in FIG. 8B, after the first process 120, the protective layer 130 is formed over the feature structure 810 and the top surface 112 of the semiconductor substrate 110 in the first chamber 140, in accordance with some embodiments. In some embodiments, the protective layer 130 covers a top surface 812a and sidewalls 812b and 812c of the element 812 and the top surface 112 of the semiconductor substrate 110.

The protective layer 130 is configured to protect the top surface 112 of the semiconductor substrate 110 and the feature structure 810 from being contaminated during a subsequent queue time, in accordance with some embodiments. In some embodiments, the protective layer 130 is configured to remove outgassing from the semiconductor substrate 110 and the feature structure 810 during the subsequent queue time.

In some embodiments, the protective layer 130 covers the substantially entire top surface 812a and the substantially entire sidewalls 812b and 812c of the element 812 and the substantially entire top surface 112. In some other embodiments, as shown in FIG. 9, the protective layer 130 covers the element 812 (e.g., a conductive structure or a semiconductor structure) and a portion of the top surface 112.

That is, the protective layer 130 of FIG. 9 exposes another portion of the top surface 112. The exposed top surface 112 may be a passive surface formed by a passive material (e.g., an oxide material, a nitride material, or a dielectric material), which prevents the exposed top surface 112 from being undesirably affected during the subsequent queue time.

The formation of the protective layer 130 includes an oxidation process, a selective deposition process (e.g., a selective chemical vapor deposition process), a photolithography process, a printing process, or another suitable process. In some embodiments, the protective layer 130 is formed using the oxidation process, and the protective layer 130 includes metal oxide or semiconductor oxide.

As shown in FIG. 8B, the protective layer 130 conformally covers the top surface 812a and the sidewalls 812b and 812c of the element 812 and the top surface 112 of the semiconductor substrate 110, in accordance with some embodiments. In some other embodiments, as shown in FIG. 10, the protective layer 130 is a planar layer.

In some embodiments, materials of the element 812 and the protective layer 130 are different, which raises the etching selectivity of the protective layer 130 to the element 812. In some embodiments, the material of the protective layer 130 is different from the materials of the element 812 and the semiconductor substrate 110, which raises the etching selectivity of the protective layer 130 to the element 812 and the semiconductor substrate 110.

Figure 8C:
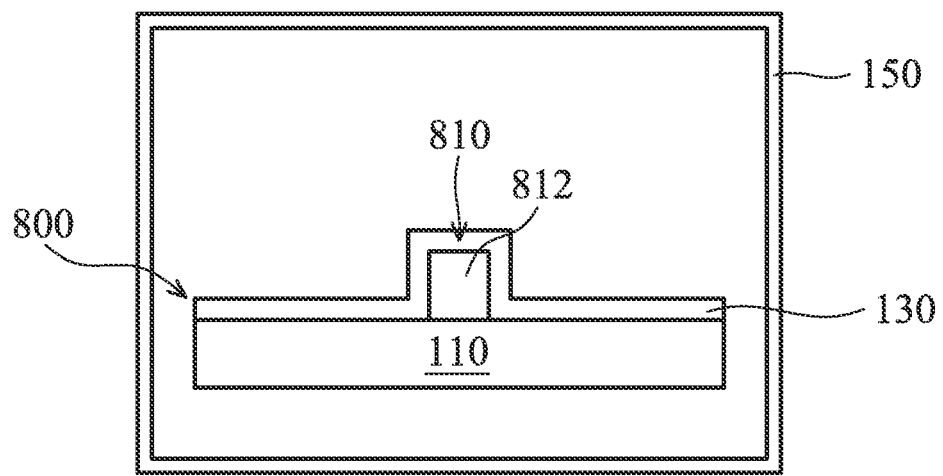

As shown in FIG. 8C, the first transferring process is performed to transfer the semiconductor substrate 110, the protective layer 130, and the feature structure 810 from the first chamber 140 into the substrate carrier 150, in accordance with some embodiments. Thereafter, the semiconductor substrate 110, the protective layer 130, and the feature structure 810 are kept in the substrate carrier 150 for a queue time to wait until a chamber (or a tool) for performing the next process is available, in accordance with some embodiments.

Figure 8D:
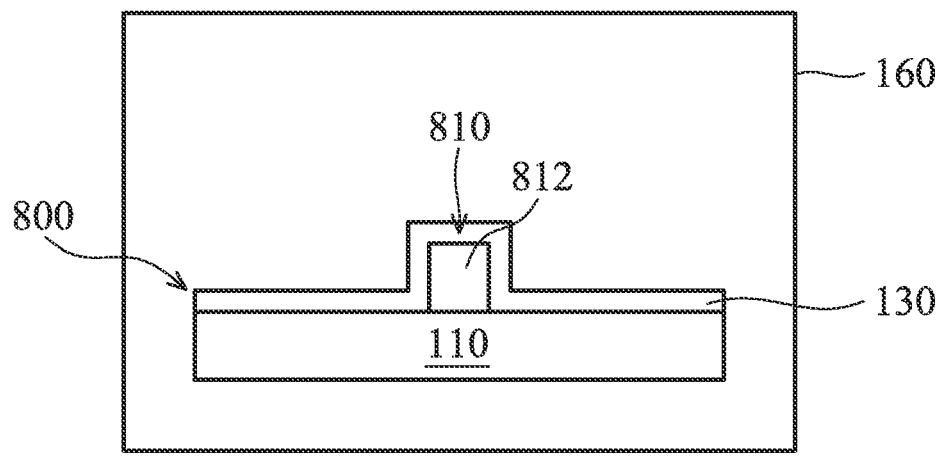

As shown in FIG. 8D, after the queue time, the second transferring process is performed to transfer the semiconductor substrate 110, the protective layer 130, and the feature structure 810 from the substrate carrier 150 into the second chamber 160, in accordance with some embodiments. The semiconductor substrate 110, the protective layer 130, and the feature structure 810 are kept in the substrate carrier 150 during the substantially entire first time interval between the first transferring process and the second transferring process, in accordance with some embodiments.

Figure 8E:
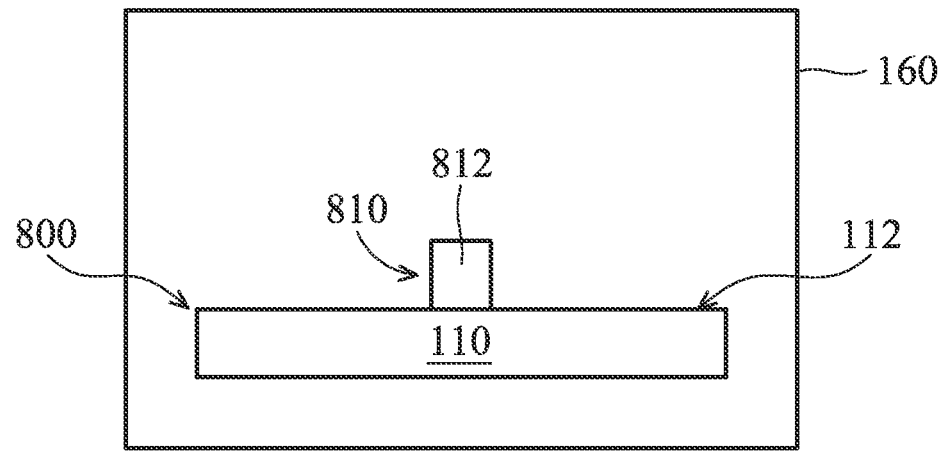
Figure 8F:
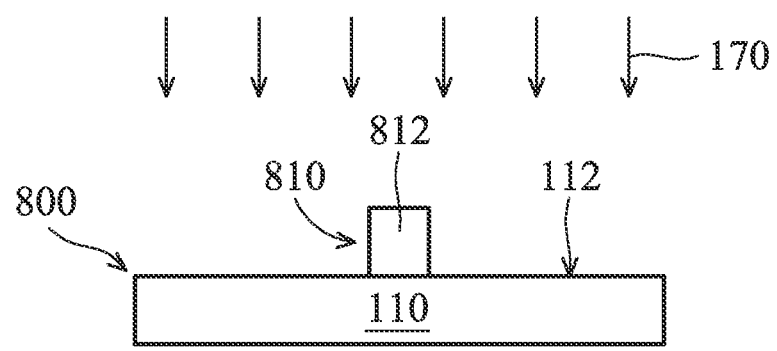

As shown in FIG. 8E, the substantially entire protective layer 130 is removed in the second chamber 160, in accordance with some embodiments. A negligible portion of the protective layer 130 may be left after the removal process. As shown in FIG. 8F, after the removal of the protective layer 130, the second process 170 is performed over the top surface 112 of the semiconductor substrate 110 and/or the feature structure 810, in accordance with some embodiments.

The protective layer 130 is an outermost layer of the semiconductor device structure 800 during the substantially entire second time interval between the formation of the protective layer 130 and the removal of the protective layer 130, in accordance with some embodiments. That is, there is no layer or element formed over the protective layer 130 during the substantially entire second time interval, in accordance with some embodiments.

Since the protective layer 130 is removed, the contamination formed over the protective layer 130 during the queue time is removed as well. Therefore, the top surface 112 and the feature structure 810 are kept clean after the queue time. As a result, the acceptable queue time is prolonged, which makes the second process more manufacturable and improves the yield of the second process and the performance of the semiconductor device structure 800.

Figure 12:
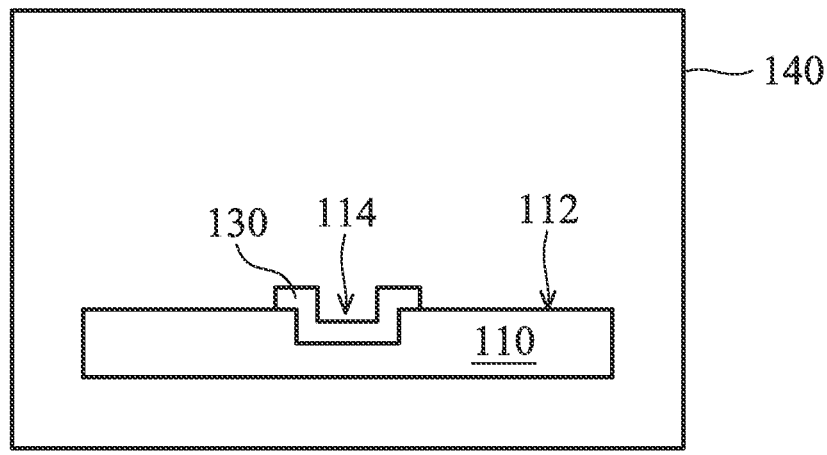
FIG. 12 is a cross-sectional view of a variation of the stage of FIG. 11B, in accordance with some embodiments.
Figure 13:
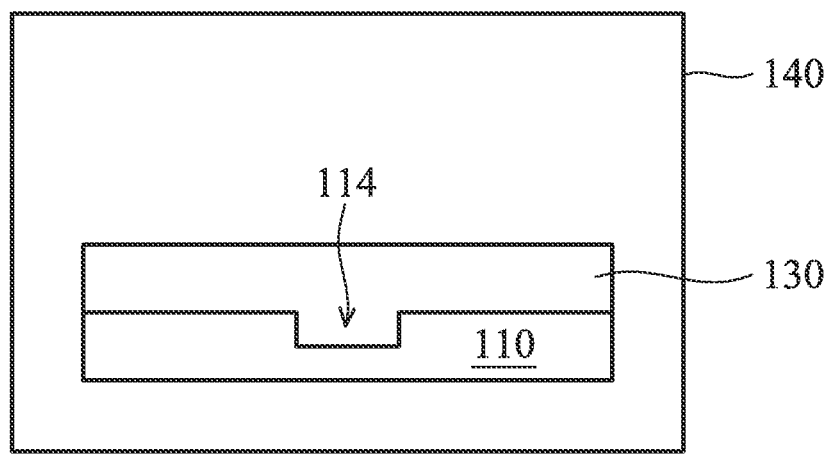
FIG. 13 is a cross-sectional view of a variation of the stage of FIG. 11B, in accordance with some embodiments.

FIGS. 11A-11F are cross-sectional views of various stages of a process for forming a semiconductor device structure 1100, in accordance with some embodiments. FIG. 12 is a cross-sectional view of a variation of the stage of FIG. 11B, in accordance with some embodiments. FIG. 13 is a cross-sectional view of a variation of the stage of FIG. 11B, in accordance with some embodiments.

Figure 11A:
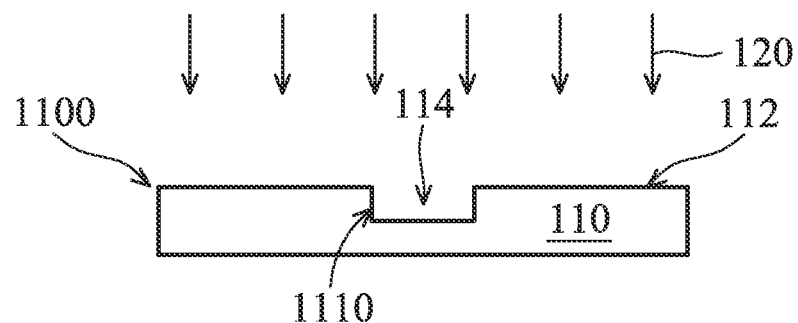
FIGS. 11A-11F are cross-sectional views of various stages of a process for forming a semiconductor device structure, in accordance with some embodiments.

It should be noted that the embodiment of FIGS. 11A-11F is a detailed embodiment of FIGS. 1A-1F, and FIGS. 11A-11F show a feature structure formed in the semiconductor substrate 110. As shown in FIG. 11A, the first process 120 is performed over the top surface 112 of the semiconductor substrate 110 to form a feature structure 1110, in accordance with some embodiments. The feature structure 1110 includes a recess 114, in accordance with some embodiments. The first process 120 includes a photolithography process and an etching process or another suitable process.

Figure 11B:
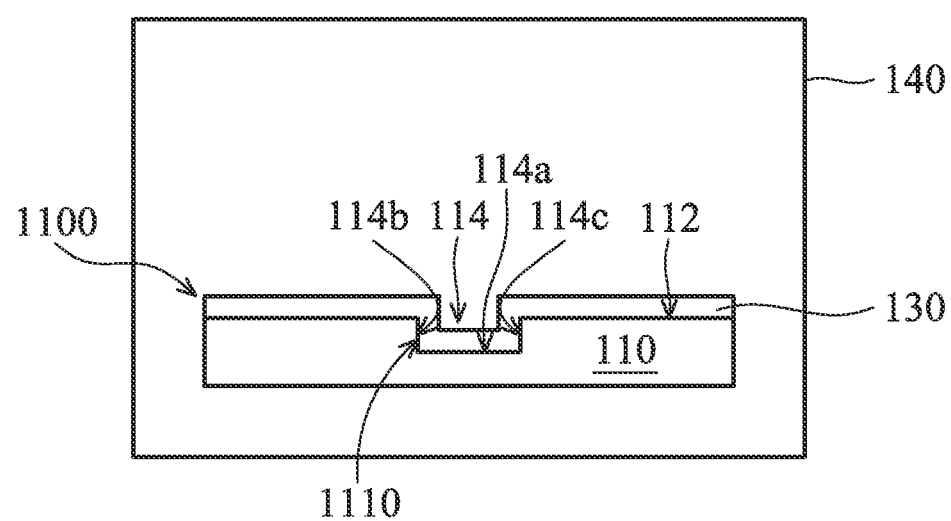

As shown in FIG. 11B, after the first process 120, the protective layer 130 is formed over the feature structure 1110 and the top surface 112 of the semiconductor substrate 110 in the first chamber 140, in accordance with some embodiments. In some embodiments, the protective layer 130 covers a bottom surface 114a and inner walls 114b and 114c of the recess 114 and the top surface 112 of the semiconductor substrate 110.

The protective layer 130 is configured to protect the top surface 112 of the semiconductor substrate 110 and the recess 114 from being contaminated during a subsequent queue time, in accordance with some embodiments. In some embodiments, the protective layer 130 is configured to remove outgassing from the semiconductor substrate 110 during the subsequent queue time.

In some embodiments, the protective layer 130 covers the substantially entire bottom surface 114a and the substantially entire inner walls 114b and 114c of the recess 114 and the substantially entire top surface 112. In some other embodiments, as shown in FIG. 12, the protective layer 130 covers the recess 114 and a portion of the top surface 112. That is, the protective layer 130 of FIG. 12 exposes another portion of the top surface 112.

The exposed top surface 112 may be a passive surface formed by a passive material (e.g., an oxide material, a nitride material, or a dielectric material), which prevents the exposed top surface 112 from being oxidized during the subsequent queue time. The formation of the protective layer 130 includes an oxidation process, a selective deposition process (e.g., a selective chemical vapor deposition process), a photolithography process, a printing process, or another suitable process.

As shown in FIG. 11B, the protective layer 130 conformally covers the bottom surface 114a and the inner walls 114b and 114c of the recess 114 and the top surface 112 of the semiconductor substrate 110, in accordance with some embodiments. In some other embodiments, as shown in FIG. 13, the protective layer 130 is a planar layer.

Figure 11C:
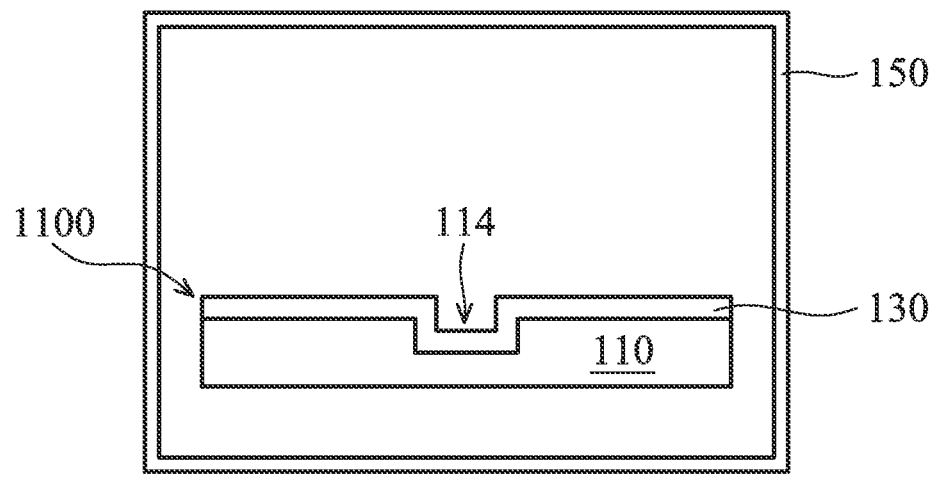

As shown in FIG. 11C, the first transferring process is performed to transfer the semiconductor substrate 110 and the protective layer 130 from the first chamber 140 into the substrate carrier 150, in accordance with some embodiments. Thereafter, the semiconductor substrate 110 and the protective layer 130 are kept in the substrate carrier 150 for a queue time to wait until a chamber (or a tool) for performing the next process is available, in accordance with some embodiments.

Figure 11D:
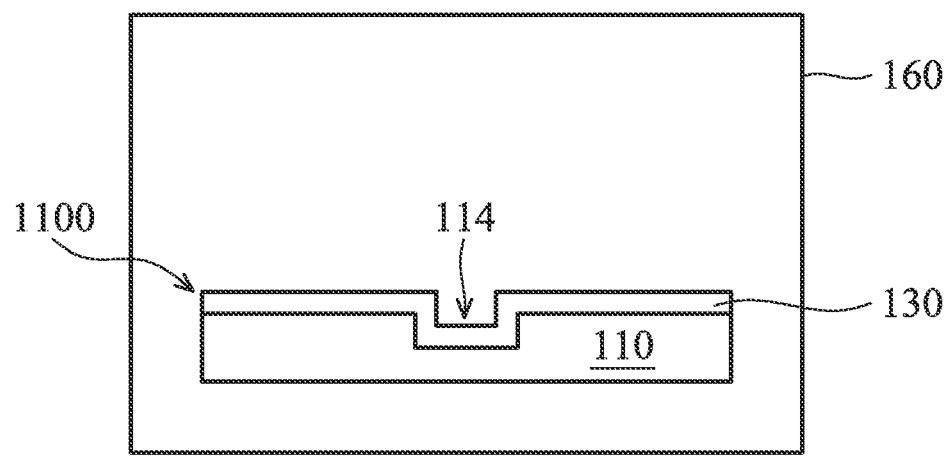

As shown in FIG. 11D, after the queue time, the second transferring process is performed to transfer the semiconductor substrate 110 and the protective layer 130 from the substrate carrier 150 into the second chamber 160, in accordance with some embodiments. The semiconductor substrate 110 and the protective layer 130 are kept in the substrate carrier 150 during the substantially entire first time interval between the first transferring process and the second transferring process, in accordance with some embodiments.

Figure 11E:
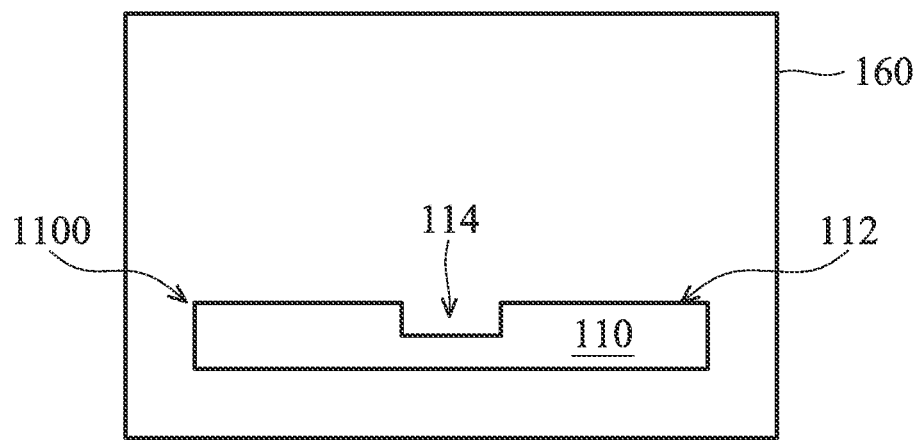
Figure 11F:
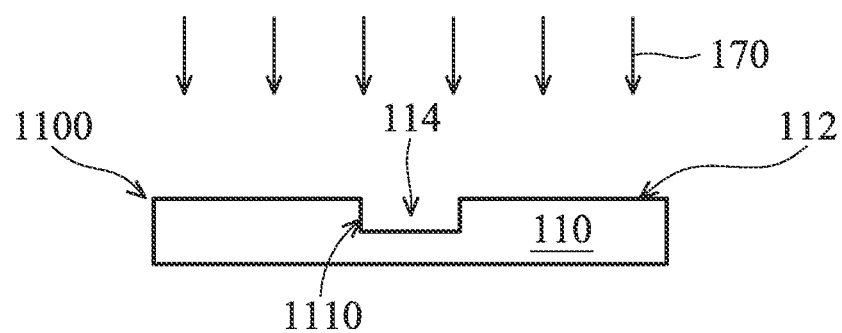

As shown in FIG. 11E, the substantially entire protective layer 130 is removed in the second chamber 160, in accordance with some embodiments. A negligible portion of the protective layer 130 may be left after the removal process. As shown in FIG. 11F, after the removal of the protective layer 130, the second process 170 is performed over the top surface 112 of the semiconductor substrate 110 and/or the feature structure 1110, in accordance with some embodiments.

The protective layer 130 is an outermost layer of the semiconductor device structure 1100 during the substantially entire second time interval between the formation of the protective layer 130 and the removal of the protective layer 130, in accordance with some embodiments. That is, there is no layer or element formed over the protective layer 130 during the substantially entire second time interval, in accordance with some embodiments.

Since the protective layer 130 is removed, the contamination formed over the protective layer 130 during the queue time is removed as well. Therefore, the top surface 112 and the feature structure 1110 are kept clean after the queue time. As a result, the acceptable queue time is prolonged, which makes the second process more manufacturable and improves the yield of the second process and the performance of the semiconductor device structure 1100.

Figure 14A:
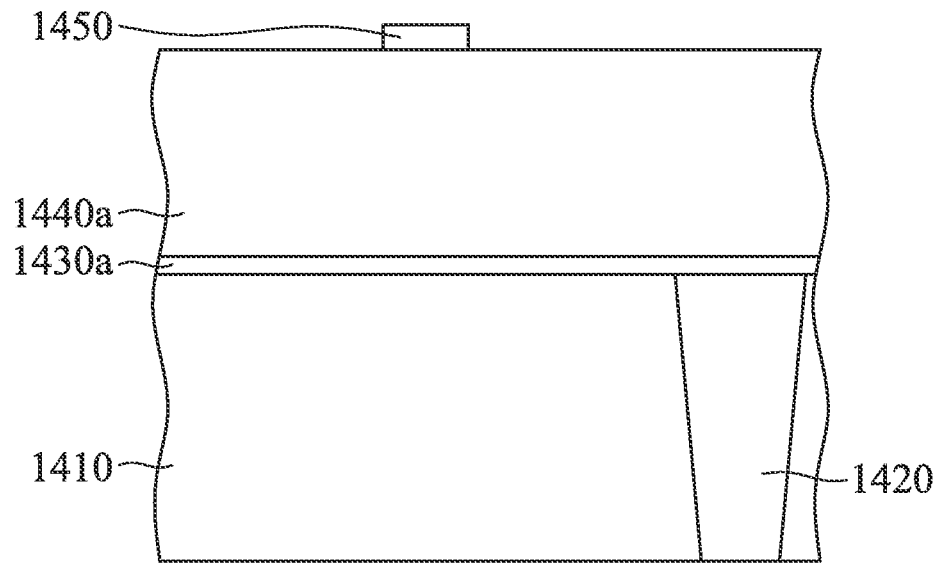
FIGS. 14A-14Q are cross-sectional views of various stages of a process for forming a semiconductor device structure, in accordance with some embodiments.
Figure 14B:
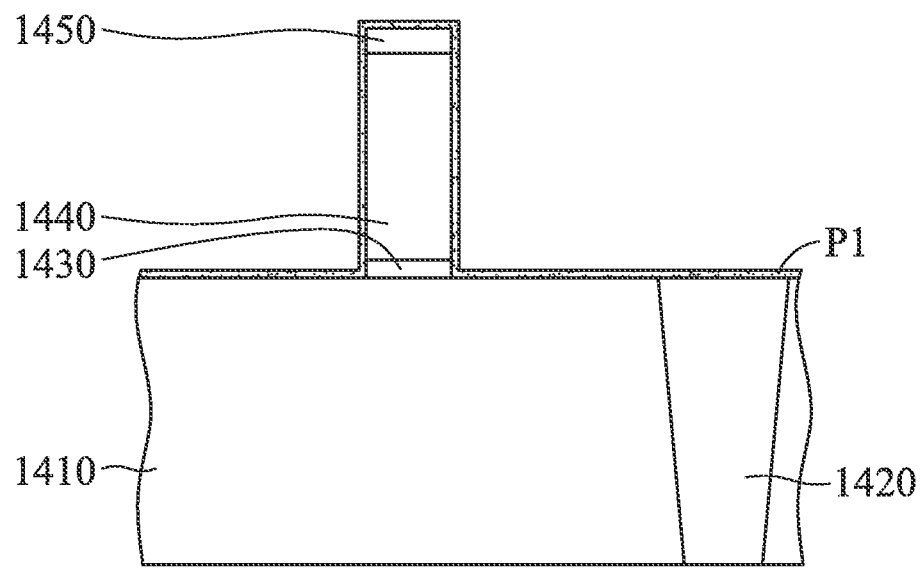
Figure 14C:
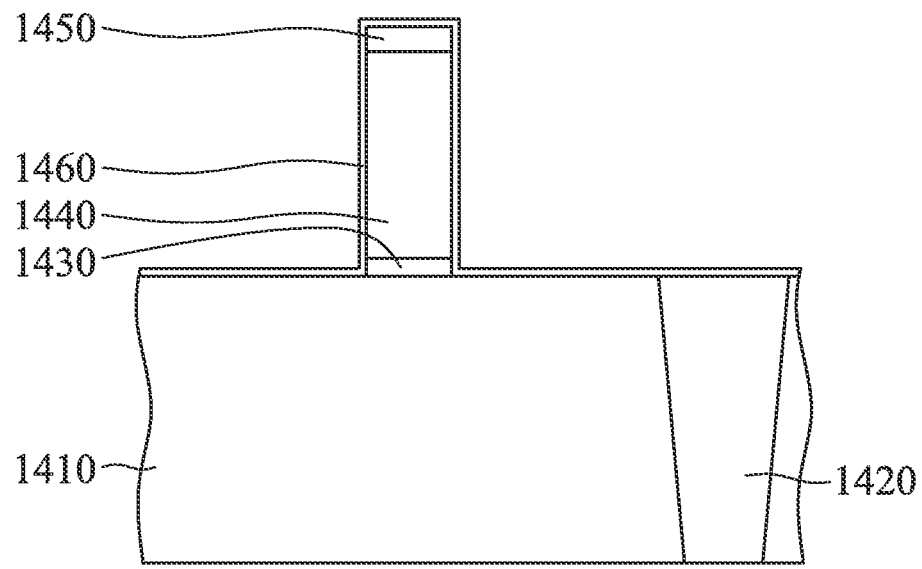
Figure 14D:
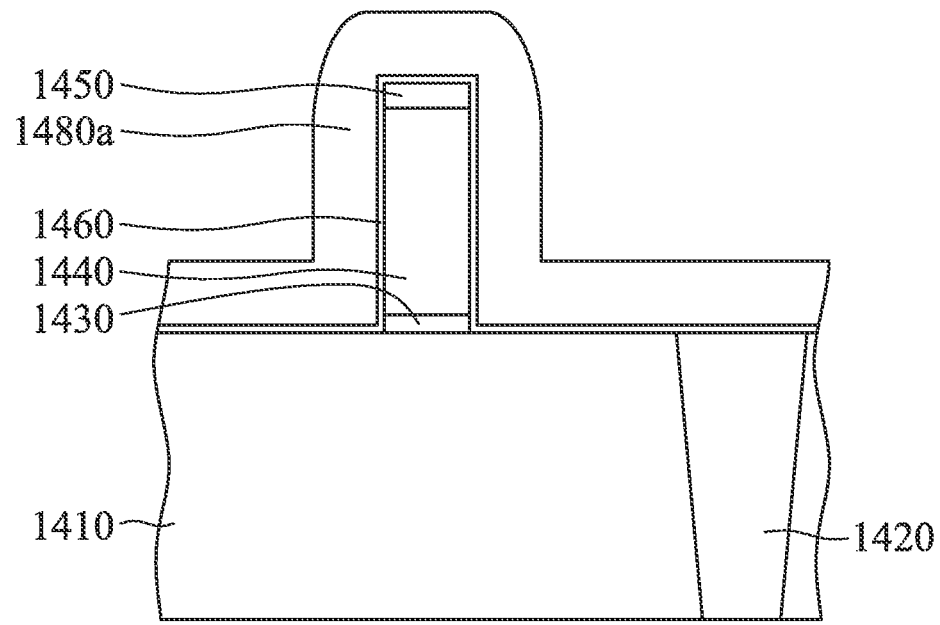
Figure 14E:
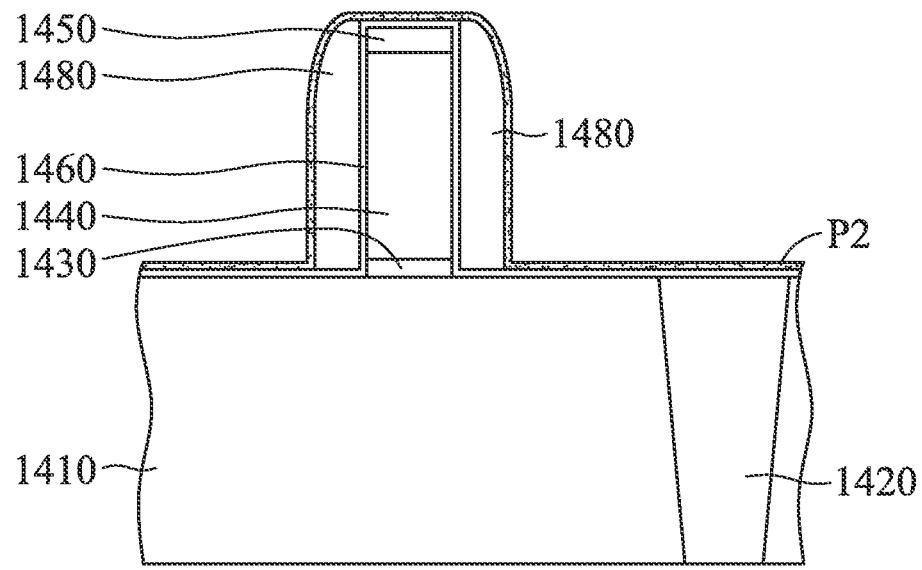
Figure 14F:
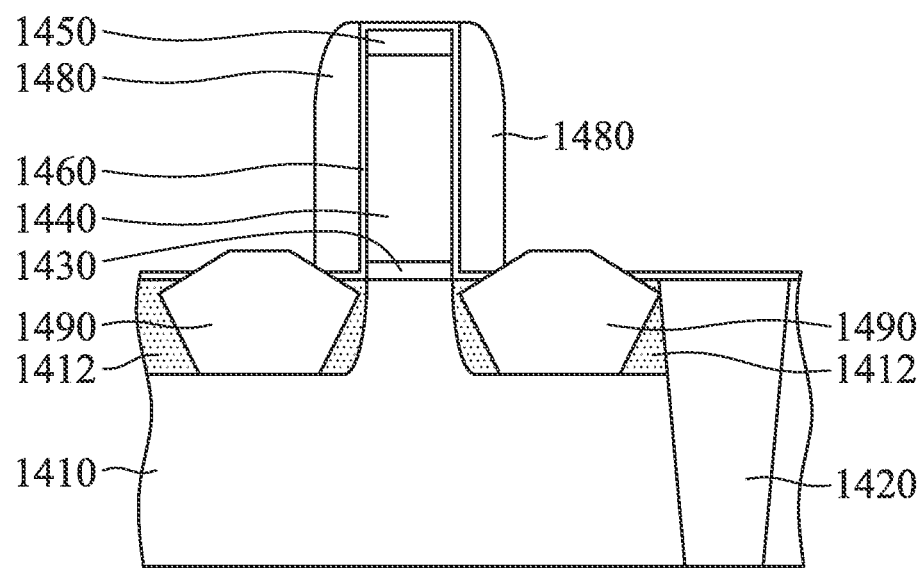
Figure 14G:
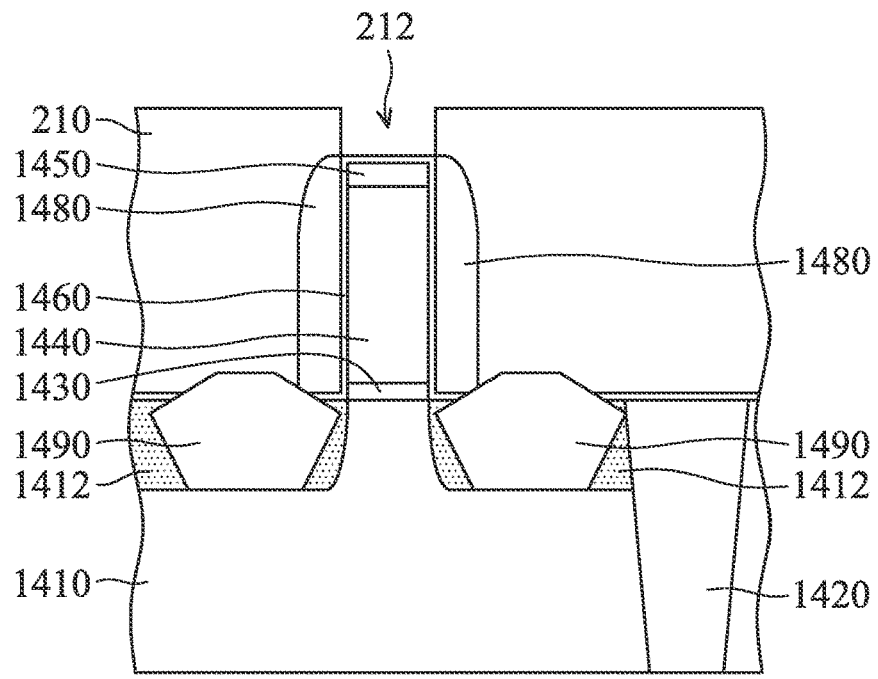
Figure 14H:
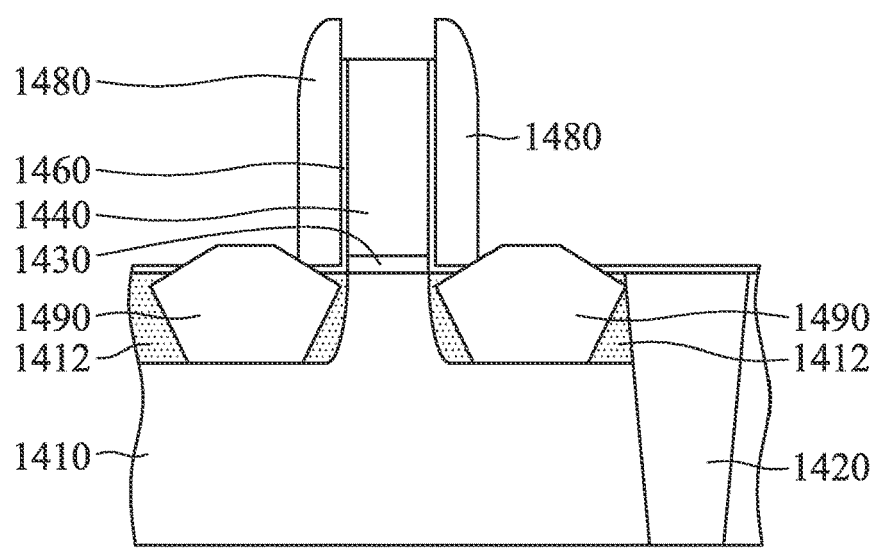
Figure 14I:
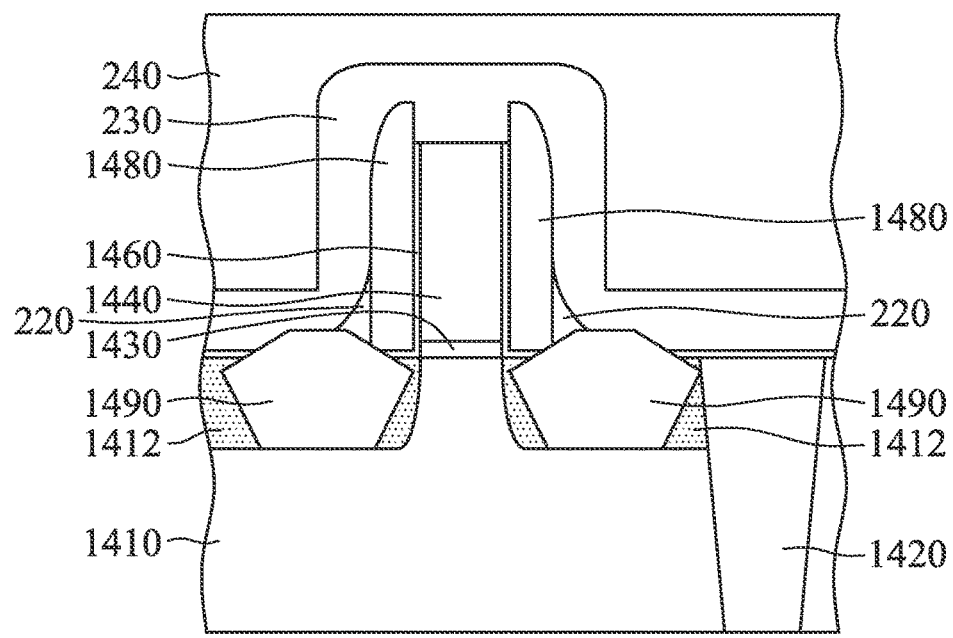
Figure 14J:
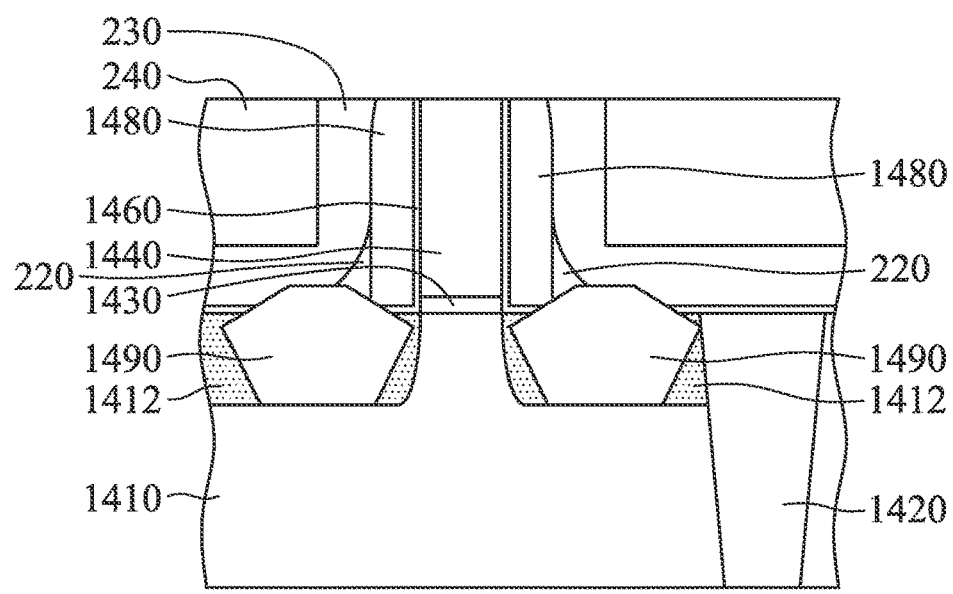
Figure 14K:
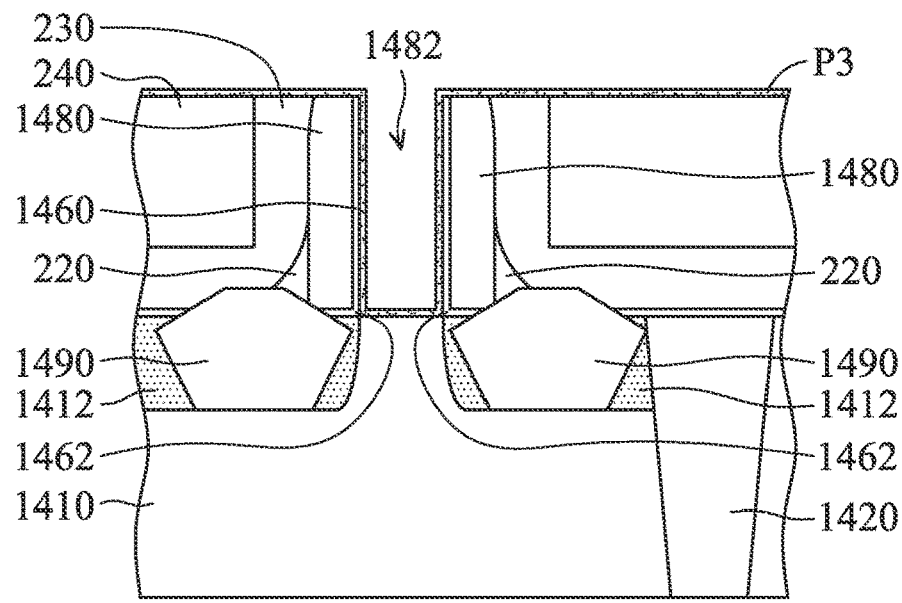
Figure 14L:
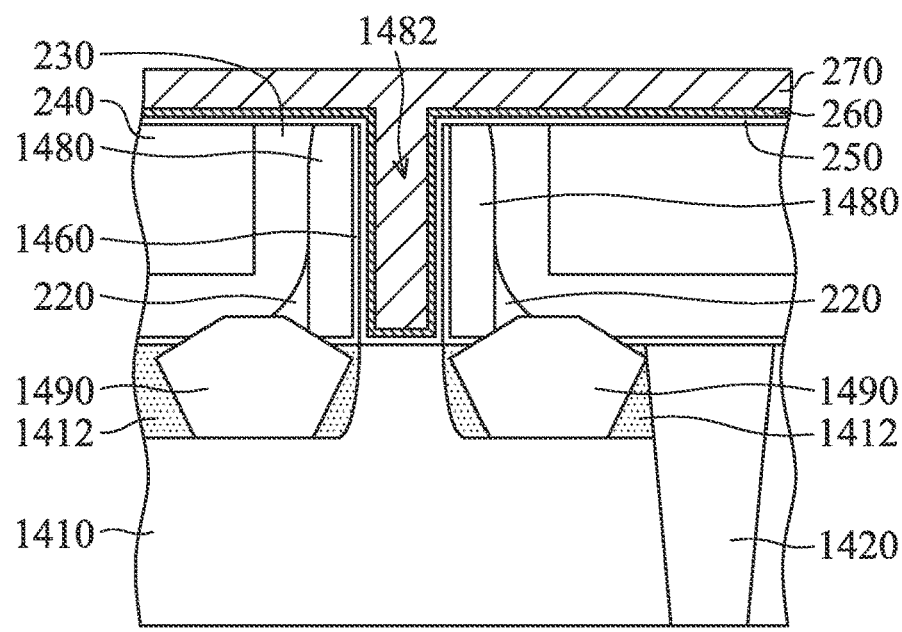
Figure 14M:
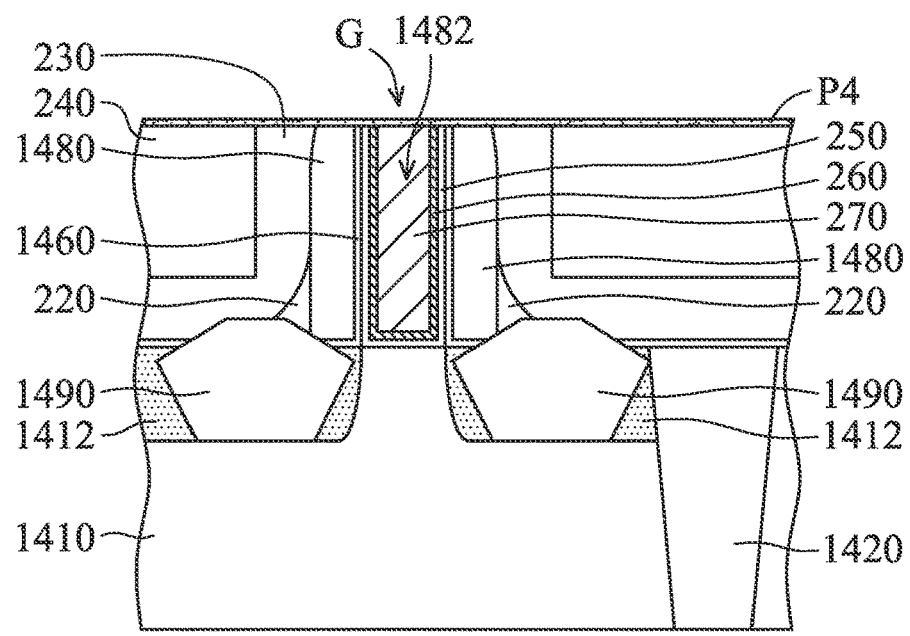
Figure 14N:
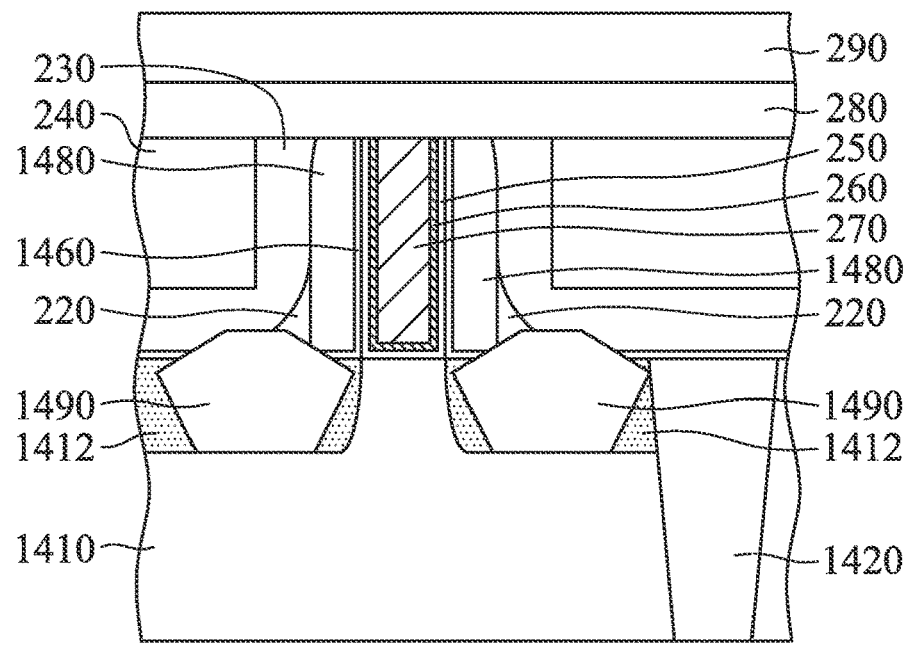
Figure 14O:
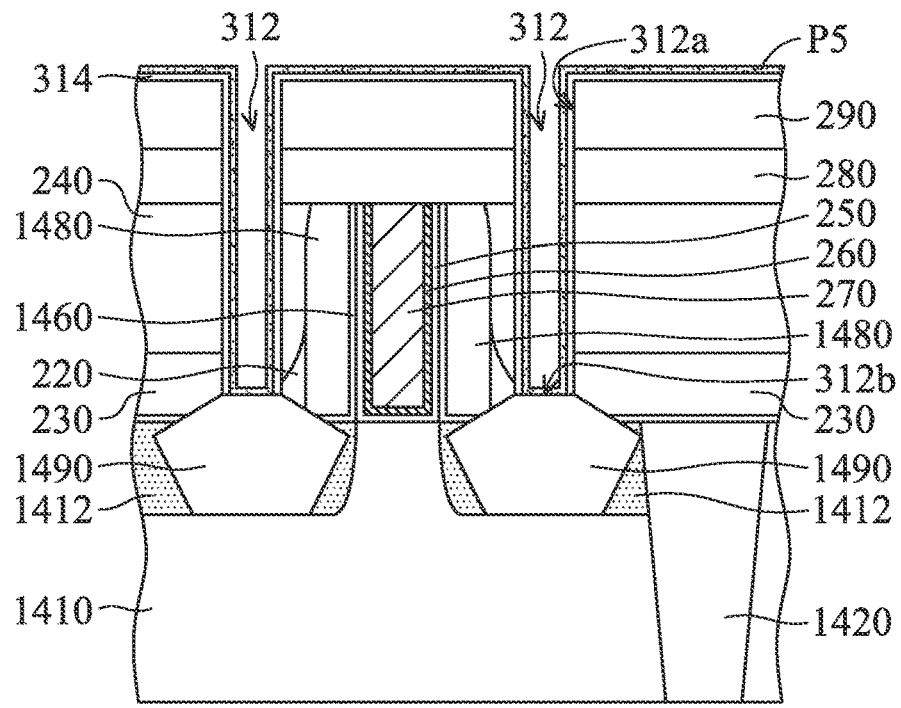
Figure 14P:
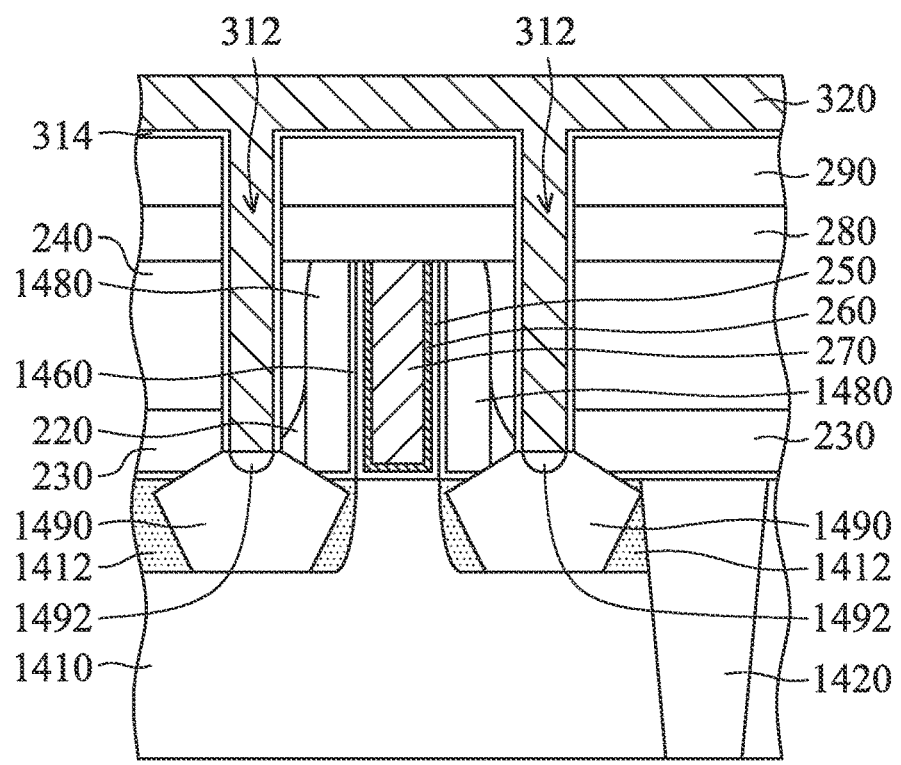
Figure 14Q:
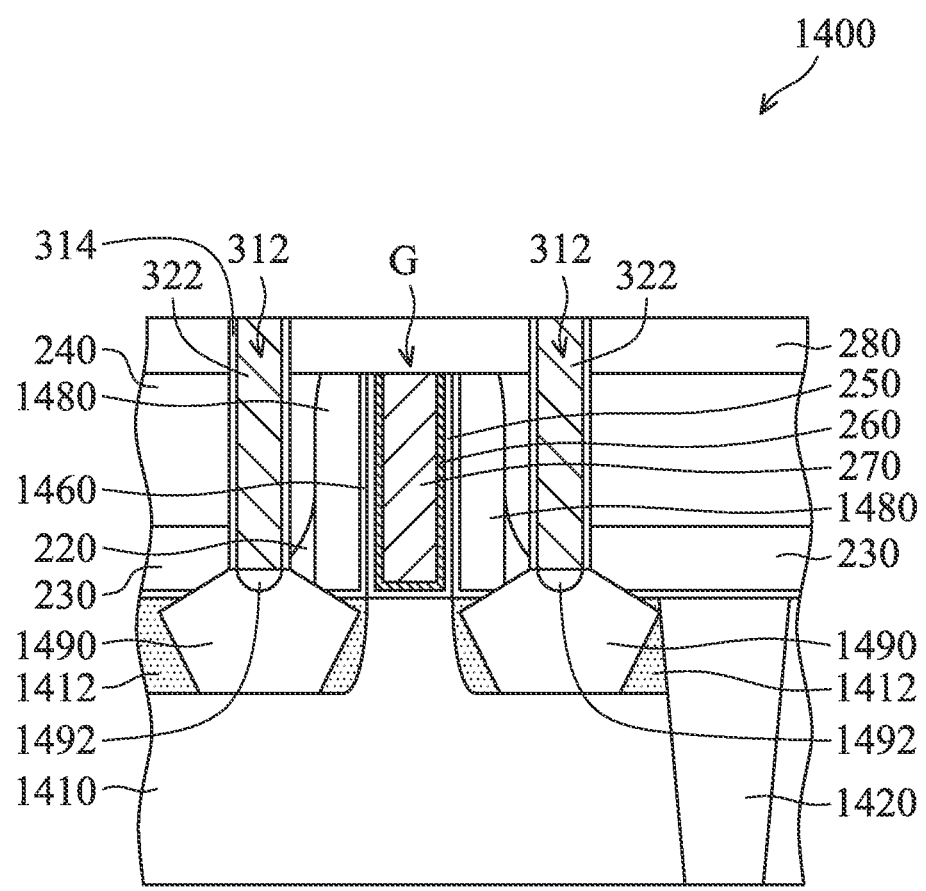

FIGS. 14A-14Q are cross-sectional views of various stages of a process for forming a semiconductor device structure 1400, in accordance with some embodiments. The embodiment of FIGS. 14A-14Q is an exemplary embodiment applying the protective layer mentioned above in a process for forming a transistor.

As shown in FIG. 14A, a semiconductor substrate 1410 is provided. The semiconductor substrate 1410 is the same as or similar to the semiconductor substrate 110. As shown in FIG. 14A, an isolation structure 1420 is formed in the semiconductor substrate 1410, in accordance with some embodiments. The isolation structure 1420 is configured to define and electrically isolate various device elements (not shown) formed in the semiconductor substrate 1410, in accordance with some embodiments.

Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

The isolation structure 1420 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The isolation structure 1420 is formed by using an isolation technology, such as local oxidation of semiconductor (LOCOS), shallow trench isolation (STI), or the like, in accordance with some embodiments.

In some embodiments, the formation of the isolation structure 1420 includes patterning the semiconductor substrate 1410 by performing a photolithography process and an etching process to the semiconductor substrate 1410 so as to form a trench in the semiconductor substrate 1410; and filling the trench with the dielectric material.

The etching process for forming the trench includes a dry etching process, a wet etching process, a plasma etching process, or a combination thereof, in accordance with some embodiments. The filling of the trench includes a chemical vapor deposition process, in accordance with some embodiments. In some embodiments, the filled trench has a multi-layer structure, such as a thermal oxide liner layer filled with silicon nitride or silicon oxide.

As shown in FIG. 14A, a gate dielectric material layer 1430*a* is deposited over the semiconductor substrate 1410, in accordance with some embodiments. The gate dielectric material layer 1430*a* is made of silicon oxide, in accordance with some embodiments. The gate dielectric material layer 1430*a* is deposited using a chemical vapor deposition process (CVD process), in accordance with some embodiments.

As shown in FIG. 14A, a dummy gate material layer 1440*a* is deposited over the gate dielectric material layer 1430*a*, in accordance with some embodiments. The dummy gate material layer 1440*a* is made of polysilicon, in accordance with some embodiments. The dummy gate material layer 1440*a* is deposited using a chemical vapor deposition process, in accordance with some embodiments.

As shown in FIG. 14A, a mask layer 1450 is formed over the dummy gate material layer 1440*a*, in accordance with some embodiments. The mask layer 1450 exposes a portion of the dummy gate material layer 1440*a*, in accordance with some embodiments. In some embodiments, the mask layer 1450 includes oxide or nitride, such as silicon oxide, silicon oxynitride, silicon nitride, or the like. The mask layer 1450 is formed by a depositing process (such as a chemical vapor deposition process), a photolithography process, and an etching process, in accordance with some embodiments.

As shown in FIG. 14B, the dummy gate material layer 1440*a* exposed by the mask layer 1450 is removed, and the gate dielectric material layer 1430*a* under the removed dummy gate material layer 1440*a* is also removed, in accordance with some embodiments. The dummy gate material layer 1440*a* remaining under the mask layer 1450 forms a dummy gate 1440, in accordance with some embodiments. The gate dielectric material layer 1430*a* remaining under the dummy gate 1440 forms a gate dielectric layer 1430, in accordance with some embodiments. The removal process includes a dry etching process, in accordance with some embodiments.

After the removal process, the next stage is a cleaning process to remove the residues formed from the removal process of FIG. 14B. However, before the cleaning process, the semiconductor substrate 1410 needs to be kept in the substrate carrier 150 (as shown in FIG. 1C) for a queue time to wait until a cleaning chamber (or a cleaning tool) is available, in accordance with some embodiments.

For preventing the contamination of the semiconductor substrate 1410 during the queue time, the stages of FIGS. 1B and 1C are performed to form a protective layer P1 covering the semiconductor substrate 1410, the mask layer 1450, the dummy gate 1440, and the gate dielectric layer 1430, in accordance with some embodiments.

The materials and the formation methods of the protective layer P1 and the protective layer 130 of FIG. 1B are the same, in accordance with some embodiments. For the sake of simplicity, FIG. 14B does not show the first chamber 140 of FIG. 1B and the substrate carrier 150 of FIG. 1C.

As shown in FIG. 14C, after keeping the semiconductor substrate 1410 in the substrate carrier 150 of FIG. 1C for the queue time, the stages of FIGS. 1D to 1F are performed to remove the protective layers P1 and perform a cleaning process (i.e., the second process 170 of FIG. 1F) over the semiconductor substrate 1410, in accordance with some embodiments.

As shown in FIG. 14C, a liner layer 1460 is formed over the semiconductor substrate 1410 to cover the mask layer 1450, the dummy gate 1440, and the gate dielectric layer 1430, in accordance with some embodiments. The liner layer 1460 is configured to protect spacers formed subsequently from damage during a dummy-gate removal process, in accordance with some embodiments. The liner layer 1460 includes oxide, in accordance with some embodiments.

The liner layer 1460 is formed by an atomic layer deposition (ALD) process, a chemical vapor deposition process, or a physical vapor deposition (PVD) process, in accordance with some embodiments. The liner layer 1460 conformally covers the mask layer 1450, the dummy gate 1440, and the gate dielectric layer 1430, in accordance with some embodiments.

As shown in FIG. 14D, a spacer layer 1480*a* is formed over the liner layer 1460 to cover the mask layer 1450, the dummy gate 1440, and the gate dielectric layer 1430, in accordance with some embodiments. The spacer layer 1480*a* includes an insulating material, such as silicon oxide or silicon nitride. The spacer layer 1480*a* is formed using a chemical vapor deposition process, in accordance with some embodiments.

As shown in FIGS. 14D and 14E, an anisotropic etching process is performed to remove a portion of the spacer layer 1480*a*, in accordance with some embodiments. The spacer layer 1480*a* remaining over the sidewalls of the mask layer 1450, the dummy gate 1440, and the gate dielectric layer 1430 forms spacers 1480, in accordance with some embodiments.

The spacers 1480 are configured to electrically isolate a gate formed subsequently from other devices and configured to act as a mask layer in a subsequent ion implantation process, in accordance with some embodiments. The anisotropic etching process includes a dry etching process, in accordance with some embodiments.

As shown in FIG. 14E, the stages of FIGS. 1B and 1C are performed to form a protective layer P2 covering the semiconductor substrate 1410, the mask layer 1450, the dummy gate 1440, the gate dielectric layer 1430, the liner layer 1460, and the spacers 1480, in accordance with some embodiments. The materials and the formation methods of the protective layer P2 and the protective layer 130 of FIG. 1B are the same, in accordance with some embodiments.

As shown in FIG. 14F, after keeping the semiconductor substrate 1410 in the substrate carrier 150 of FIG. 1C for the queue time, the stages of FIGS. 1D to 1F are performed to remove the protective layers P2 and perform a cleaning process over the semiconductor substrate 1410, in accordance with some embodiments.

As shown in FIG. 14F, heavily doped regions 1412 are formed in the semiconductor substrate 1410, in accordance with some embodiments. The heavily doped regions 1412 are formed using an ion implantation process, in accordance with some embodiments. The ion implantation process is performed to introduce p-type impurities (e.g., boron) or n-type impurities (e.g., phosphorus) into the semiconductor substrate 1410, in accordance with some embodiments.

The heavily doped regions 1412 are a heavily doped source region and a heavily doped drain region, in accordance with some embodiments. The heavily doped regions 1412 are located at the two opposite sides of the dummy gate 1440, in accordance with some embodiments.

As shown in FIG. 14F, stressors 1490 are formed in the heavily doped regions 1412 by using suitable processes, in accordance with some embodiments. The suitable processes include, for example, an etching process for removing a portion of the semiconductor substrate 1410 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

As shown in FIG. 14G, a mask layer 210 is formed over the spacers 1480 and the semiconductor substrate 1410, in accordance with some embodiments. The mask layer 210 is a photoresist layer, in accordance with some embodiments. The mask layer 210 has an opening 212 exposing the liner layer 1460 over the mask layer 1450, in accordance with some embodiments.

As shown in FIG. 14H, the mask layer 1450 and the liner layer 1460 over the mask layer 1450 are removed through the opening 212, in accordance with some embodiments. The removal process includes a dry etching process, in accordance with some embodiments. Thereafter, the mask layer 210 is removed.

As shown in FIG. 14I, spacer oxide layers 220 may be formed over the spacers 1480 and the stressors 1490 by using, for example, a chemical vapor deposition process. The spacer oxide layers 220 may fill the gaps between the spacers 1480 and the stressors 1490 to facilitate films, which are subsequently formed, to cover the spacers 1480 and the stressors 1490 smoothly. However, in some other embodiments, the spacer oxide layers 220 are not formed.

As shown in FIG. 14I, a contact etch stop layer 230 is formed over the semiconductor substrate 1410 to cover the stressors 1490, in accordance with some embodiments. The contact etch stop layer 230 includes a dielectric material, in accordance with some embodiments.

The contact etch stop layer 230 includes silicon nitride, in accordance with some embodiments. The contact etch stop layer 230 is formed over the stressors 1490, the spacers 1480, the dummy gate 1440, and the semiconductor substrate 1410, in accordance with some embodiments. In some other embodiments, the contact etch stop layer 230 is not formed.

As shown in FIG. 14I, an insulating layer 240 is deposited over the contact etch stop layer 230, in accordance with some embodiments. The insulating layer 240 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The insulating layer 240 is deposited using a CVD process, a HDPCVD process, a spin-on process, a sputtering process, or a combination thereof, in accordance with some embodiments.

Afterwards, as shown in FIG. 14J, a planarization process is performed on the insulating layer 240 until a top surface of the dummy gate 1440 is exposed, in accordance with some embodiments. The planarization process includes a chemical mechanical polishing (CMP) process, in accordance with some embodiments. After the planarization process is performed, the insulating layer 240 has a substantially planar surface to facilitate subsequent process steps.

As shown in FIG. 14K, the dummy gate 1440 is removed, in accordance with some embodiments. The removal process for removing the dummy gate 1440 includes a wet etching process, a dry etching process, or a combination thereof, in accordance with some embodiments. In some embodiments, the gate dielectric layer 1430 is also removed. After the dummy gate 1440 and the gate dielectric layer 1430 are removed, an opening 1482 is formed between the spacers 1480. The opening 1482 is a trench, in accordance with some embodiments.

As shown in FIG. 14K, the stages of FIGS. 1B and 1C are performed to form a protective layer P3 covering the opening 1482, the semiconductor substrate 1410, the contact etch stop layer 230, the insulating layer 240, the liner layer 1460, and the spacers 1480, in accordance with some embodiments. The materials and the formation methods of the protective layer P3 and the protective layer 130 of FIG. 1B are the same, in accordance with some embodiments.

As shown in FIG. 14L, after keeping the semiconductor substrate 1410 in the substrate carrier 150 of FIG. 1C for the queue time, the stages of FIGS. 1D to 1F are performed to remove the protective layers P3 and perform a cleaning process over the semiconductor substrate 1410, in accordance with some embodiments.

As shown in FIG. 14L, a gate dielectric layer 250 is formed to cover a bottom of the opening 1482, in accordance with some embodiments. The gate dielectric layer 250 further covers the inner walls of the opening 1482, top surfaces of the liner layer 1460, the spacers 1480, the contact etch stop layer 230, and the insulating layer 240, in accordance with some embodiments.

The gate dielectric layer 250 includes a dielectric material, such as a high dielectric constant (high-k) material. The high-k material includes hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), other suitable high-k dielectric materials, or combinations thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof, in accordance with some embodiments.

The gate dielectric layer 250 is deposited by any suitable process, such as atomic layer deposition (ALD), chemical vapor deposition (CVD), physical vapor deposition (PVD), sputtering, plating, other suitable processes, or combinations thereof, in accordance with some embodiments. In some embodiments, the gate dielectric layer 250 needs to be further annealed.

An intermediate dielectric layer (not shown) may be formed over the semiconductor substrate 1410 before the gate dielectric layer 250 is formed. The intermediate dielectric layer includes a suitable dielectric material, such as silicon oxide, hafnium silicate, silicon oxynitride, or combinations thereof.

As shown in FIG. 14L, a work function metal layer 260 is deposited over the gate dielectric layer 250, in accordance with some embodiments. The work function metal layer 260 provides a desired work function for transistors to enhance device performance including improved threshold voltage.

In the embodiments of forming an NMOS transistor, the work function metal layer 260 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

On the other hand, in the embodiments of forming a PMOS transistor, the work function metal layer 260 can be a p-type metal capable of providing a work function value suitable for the device, such as equal to or greater than about 4.8 eV. The p-type metal includes metal, metal carbide, metal nitride, other suitable materials, or combinations thereof, in accordance with some embodiments. For example, the p-type metal is made of titanium, titanium nitride, other suitable materials, or combinations thereof.

The work function metal layer 260 is made of hafnium, zirconium, titanium, tantalum, aluminum, metal carbide (e.g., hafnium carbide, or zirconium carbide), aluminide, ruthenium or combinations thereof, in accordance with some embodiments. The work function metal layer 260 is deposited using a PVD process, CVD process, ALD process, plating process, another suitable method, or combinations thereof, in accordance with some embodiments.

As shown in FIG. 14L, a gate electrode layer 270 (also called a metal gate electrode layer) is deposited over the work function metal layer 260 to fill the opening 1482, in accordance with some embodiments. The gate electrode layer 270 includes a suitable metal material, such as aluminum, tungsten, gold, platinum, cobalt, another suitable metal, an alloy thereof, or combinations thereof, in accordance with some embodiments. The gate electrode layer 270 is deposited using a PVD process, a CVD process, a plating process, the like, or combinations thereof, in accordance with some embodiments.

Afterwards, as shown in FIG. 14M, a planarization process is performed to remove the gate electrode layer 270, the work function metal layer 260, and the gate dielectric layer 250 outside of the opening 1482, in accordance with some embodiments. The planarization process includes a chemical mechanical polishing (CMP) process or the like, in accordance with some embodiments.

The gate electrode layer 270, the work function metal layer 260, and the gate dielectric layer 250 together form a gate stack G (i.e., a metal gate stack), which is surrounded by the insulating layer 240. The gate electrode layer 270 remaining in the opening 1482 serves as a metal gate electrode of the gate stack G, in accordance with some embodiments.

As shown in FIG. 14M, the stages of FIGS. 1B and 1C are performed to form a protective layer P4 covering the gate electrode layer 270, the work function metal layer 260, the gate dielectric layer 250, the semiconductor substrate 1410, the contact etch stop layer 230, the insulating layer 240, the liner layer 1460, and the spacers 1480, in accordance with some embodiments. The materials and the formation methods of the protective layer P4 and the protective layer 130 of FIG. 1B are the same, in accordance with some embodiments.

As shown in FIG. 14N, after keeping the semiconductor substrate 1410 in the substrate carrier 150 of FIG. 1C for the queue time, the stages of FIGS. 1D to 1F are performed to remove the protective layers P4 and perform a cleaning process over the semiconductor substrate 1410, in accordance with some embodiments.

As shown in FIG. 14N, an etching stop layer 280 (also called an insulating layer or a dielectric layer) is deposited over the top surfaces of the insulating layer 240, the contact etch stop layer 230, the spacers 1480, the liner layer 1460, the work function metal layer 260, and the gate electrode layer 270, in accordance with some embodiments. The etching stop layer 280 is made of silicon nitride, in accordance with some embodiments.

As shown in FIG. 14N, a protective layer 290 is formed on the etching stop layer 280, in accordance with some embodiments. The protective layer 290 is configured to protect the etching stop layer 280 from damage during a subsequent pre-amorphized implantation (PAI) process, in accordance with some embodiments. The protective layer 290 includes a plasma-enhanced oxide (PEOX) layer, in accordance with some embodiments.

As shown in FIG. 14O, portions of the protective layer 290, the etching stop layer 280, and the insulating layer 240 are removed to form contact openings 312 passing through the protective layer 290, the etching stop layer 280, and the insulating layer 240, in accordance with some embodiments. The openings 312 expose the stressors 1490, in accordance with some embodiments. The removal process includes performing a photolithography process and an etching process, in accordance with some embodiments.

As shown in FIG. 14O, a dielectric spacer liner (DSL) layer 314 is conformally formed on the protective layer 290 and the sidewalls 312a of the contact openings 312, in accordance with some embodiments. The DSL layer 314 is configured to protect the sidewalls 312a from being damaged by the subsequent PAI process. The DSL layer 314 is made of, for example, SiOC or other suitable materials.

A pre-amorphized implantation (PAI) process is performed to reduce the dopant channeling effect and enhance dopant activation, in accordance with some embodiments. In some embodiments, silicon, germanium or carbon is used. In some other embodiments, inert gases, such as neon, argon, krypton, xenon, and/or radon, are used.

The PAI process prevents subsequently doped impurities from channeling through spaces within the crystal lattice structure and reaching depths greater than desired. Portions of the stressors 1490 exposed and located at the bottoms 312b of the openings 312 are turned into an amorphous state as a result of the PAI process.

As shown in FIG. 14O, the stages of FIGS. 1B and 1C are performed to form a protective layer P5 covering the DSL layer 314, the etching stop layer 280, the protective layer 290, the gate electrode layer 270, the work function metal layer 260, the gate dielectric layer 250, the semiconductor substrate 1410, the contact etch stop layer 230, the insulating layer 240, the liner layer 1460, and the spacers 1480, in accordance with some embodiments. The materials and the formation methods of the protective layer P5 and the protective layer 130 of FIG. 1B are the same, in accordance with some embodiments.

As shown in FIG. 14P, after keeping the semiconductor substrate 1410 in the substrate carrier 150 of FIG. 1C for the queue time, the stages of FIGS. 1D to 1F are performed to remove the protective layers P5 and perform a cleaning process over the semiconductor substrate 1410, in accordance with some embodiments.

As shown in FIG. 14P, a salicidation (self-aligned silicidation) process is performed to form metal silicide regions 1492 on/in the stressors 1490, in accordance with some embodiments. The material of the metal silicide regions 1492 is made of nickel silicide, in accordance with some embodiments.

In some embodiments, the metal silicide regions 1492 are made of a silicide material of a suitable metal material. The suitable metal material includes cobalt (Co), platinum (Pt), titanium (Ti), ytterbium (Yb), molybdenum (Mo), erbium (Er), or combinations thereof, in accordance with some embodiments. In some embodiments, the salicidation process is not performed.

As shown in FIG. 14P, a conductive layer 320 is deposited on the protective layer 290 and is filled into the openings 312 to electrically contact the metal silicide regions 1492, in accordance with some embodiments. The conductive layer 320 is formed by, for example, a PVD process or other suitable processes. The conductive layer 320 is made of, for example, tungsten or other suitable conductive materials.

As shown in FIG. 14Q, a planarization process is performed to remove the conductive layer 320 and the DSL layer 314 outside the openings 312, and the protective layer 290, in accordance with some embodiments. The planarization process includes a chemical mechanical polishing (CMP) process, in accordance with some embodiments. After the CMP process, the conductive layer 320 remaining in the openings 312 forms contact plugs 322 electrically connecting the metal silicide regions 1492 and the heavily doped regions 1412 (i.e. the S/D regions).

After the CMP process, top surfaces of the contact plugs 322, the DSL layer 314, and the etching stop layer 280 are coplanar with each other, in accordance with some embodiments. As shown in FIG. 14Q, a semiconductor device 1400 is formed. The semiconductor device 1400 is an n-type metal-oxide-semiconductor field-effect transistor (MOSFET) or a p-type MOSFET, in accordance with some embodiments.

In accordance with some embodiments, methods for forming semiconductor device structures are provided. The methods form and remove a protective layer covering a semiconductor substrate at the start and end of a queue time between a first process and a second process. Since the protective layer is removed, the contamination formed over the protective layer during the queue time is removed as well. Therefore, the surface of the semiconductor substrate is kept clean after the queue time. As a result, the acceptable queue time is prolonged, which makes the second process more manufacturable and improves the yield of the second process and the performance of the semiconductor device structure.

In accordance with some embodiments, a method for forming a semiconductor device structure is provided. The method includes performing a first process over a surface of a semiconductor substrate. The method includes forming a protective layer over the surface of the semiconductor substrate in a first chamber after the first process. The method includes performing a first transferring process to transfer the semiconductor substrate from the first chamber into a substrate carrier. The method includes performing a second transferring process to transfer the semiconductor substrate from the substrate carrier into a second chamber. The semiconductor substrate is located in the substrate carrier during a substantially entire first time interval between the first transferring process and the second transferring process. The method includes removing the substantially entire protective layer in the second chamber. The method includes performing a second process over the surface of the semiconductor substrate after the removal of the substantially entire protective layer.

In accordance with some embodiments, a method for forming a semiconductor device structure is provided. The method includes performing a first process over a surface of a semiconductor substrate. The method includes forming a protective layer over the surface of the semiconductor substrate after the first process. The method includes removing the protective layer after a queue time. Before the removal of the protective layer, the protective layer is an outermost layer of the semiconductor device structure and covers the substantially entire surface. The method includes performing a second process over the surface of the semiconductor substrate after the removal of the protective layer.

In accordance with some embodiments, a method for forming a semiconductor device structure is provided. The method includes forming a feature structure over a semiconductor substrate. The method includes forming a protective layer over the feature structure in a first chamber. The method includes performing a first transferring process to transfer the semiconductor substrate from the first chamber into a substrate carrier. The method includes performing a second transferring process to transfer the semiconductor substrate from the substrate carrier into a second chamber. The semiconductor substrate is located in the substrate carrier during a substantially entire first time interval between the first transferring process and the second transferring process. The method includes removing the protective layer in the second chamber. The method includes performing a second process over the semiconductor substrate and the feature structure after the removal of the protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    performing a first process over a first top surface of a semiconductor substrate in a first chamber, wherein the first chamber is a plasma chamber;
    after the first process, forming a protective layer over the first top surface and a first sidewall of the semiconductor substrate, wherein the first process and the forming of the protective layer are both performed in the first chamber, the protective layer comprises a first film and a second film, and the first film and the second film are made of different materials;
    performing a first transferring process to transfer the semiconductor substrate from the first chamber into a substrate carrier;
    performing a second transferring process to transfer the semiconductor substrate from the substrate carrier into a second chamber, wherein the semiconductor substrate is located in the substrate carrier during an entire first time interval between the first transferring process and the second transferring process;
    removing the protective layer in the second chamber; and
    after the removal of the protective layer, performing a second process over the first top surface of the semiconductor substrate.

2. The method for forming a semiconductor device structure as claimed in claim 1, wherein the protective layer is an outermost layer of the semiconductor device structure during an entire second time interval between the formation of the protective layer and the removal of the protective layer.

3. The method for forming a semiconductor device structure as claimed in claim 1, wherein the first process comprises a plasma etching process, and the protective layer is formed using a plasma deposition process.

4. The method for forming a semiconductor device structure as claimed in claim 1, wherein the first film is between the semiconductor substrate and the second film, and the first film is made of a porous material containing carbon.

5. The method for forming a semiconductor device structure as claimed in claim 1, wherein the first process comprises a first plasma deposition process, and the protective layer is formed using a second plasma deposition process.

6. The method for forming a semiconductor device structure as claimed in claim 1, wherein the second process is performed in the second chamber.

7. The method for forming a semiconductor device structure as claimed in claim 1, wherein the first process comprises:
performing a first plasma deposition process over the semiconductor substrate to form a film over the semiconductor substrate; and
the formation of the protective layer comprises:
performing a second plasma deposition process over the film to form the protective layer covering a second top surface and second sidewalls of the film.

8. A method for forming a semiconductor device structure, comprising:
performing a first process over a top surface of a semiconductor substrate;
after the first process, forming a protective layer over the top surface and a sidewall of the semiconductor substrate in a first chamber, wherein the protective layer has a first film and a second film, and materials of the first film and the second film are different;
after a queue time, removing the protective layer in a second chamber, wherein before the removal of the protective layer, the protective layer is an outermost layer of the semiconductor device structure, and the second chamber is a plasma chamber; and
after the removal of the protective layer, performing a second process over the top surface of the semiconductor substrate in the second chamber.

9. The method for forming a semiconductor device structure as claimed in claim 8, wherein the protective layer is removed using a plasma etching process.

10. The method for forming a semiconductor device structure as claimed in claim 8, wherein the protective layer is a planar layer.

11. The method for forming a semiconductor device structure as claimed in claim 8, wherein the first chamber and the second chamber are a same chamber.

12. The method for forming a semiconductor device structure as claimed in claim 8, wherein the first film is between the second film and the semiconductor substrate, and the first film comprises a porous material.

13. The method for forming a semiconductor device structure as claimed in claim 8, wherein the formation of the protective layer comprises:
performing a deposition process over the semiconductor substrate to form the protective layer.

14. A method for forming a semiconductor device structure, comprising:
forming a feature structure in a semiconductor substrate;
forming a protective layer over the feature structure and a top surface and a sidewall of the semiconductor substrate in a first chamber, wherein the feature structure comprises a patterned recess, the protective layer has a first film and a second film, materials of the first film and the second film are different, and the protective layer conformally covers inner walls and a bottom surface of the patterned recess;
performing a first transferring process to transfer the semiconductor substrate from the first chamber into a substrate carrier;
performing a second transferring process to transfer the semiconductor substrate from the substrate carrier into a second chamber, wherein the semiconductor substrate is located in the substrate carrier during an entire first time interval between the first transferring process and the second transferring process;
removing the protective layer in the second chamber, wherein the first chamber and the second chamber are a same plasma chamber; and
after the removal of the protective layer, performing a second process over the semiconductor substrate and the feature structure.

15. The method for forming a semiconductor device structure as claimed in claim 14, wherein the formation of the patterned recess and the protective layer comprises:
performing a plasma etching process over the semiconductor substrate to form the patterned recess in the semiconductor substrate; and
performing a plasma deposition process over the semiconductor substrate to form the protective layer covering the patterned recess.

16. The method for forming a semiconductor device structure as claimed in claim 15, wherein the formation of the feature structure comprises:
forming the feature structure in the semiconductor substrate in the first chamber.

17. The method for forming a semiconductor device structure as claimed in claim 14, wherein the second process is performed in the second chamber.

18. The method for forming a semiconductor device structure as claimed in claim 1, wherein the protective layer is removed using a plasma etching process, and the second chamber is a plasma chamber.

19. The method for forming a semiconductor device structure as claimed in claim 18, wherein the second process is performed in the second chamber.

20. The method for forming a semiconductor device structure as claimed in claim 8, wherein the first film comprises a carbon material.

* * * * *